(12) United States Patent
Yabuuchi et al.

(10) Patent No.: US 10,580,490 B2
(45) Date of Patent: Mar. 3, 2020

(54) SEMICONDUCTOR DEVICE

(71) Applicant: RENESAS ELECTRONICS CORPORATION, Tokyo (JP)

(72) Inventors: Makoto Yabuuchi, Tokyo (JP); Koji Nii, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 16/192,377

(22) Filed: Nov. 15, 2018

(65) Prior Publication Data

US 2019/0198107 A1    Jun. 27, 2019

(30) Foreign Application Priority Data

Dec. 27, 2017 (JP) ................ 2017-251723

(51) Int. Cl.
  *G11C 15/04*  (2006.01)
  *G11C 5/14*   (2006.01)

(52) U.S. Cl.
  CPC .............. *G11C 15/04* (2013.01); *G11C 5/145* (2013.01)

(58) Field of Classification Search
  CPC .................. G11C 15/04; G11C 5/145
  USPC ........... 365/49.1, 49.11, 49.12, 49.13, 49.15, 365/49.16, 49.17, 49.18, 50
  See application file for complete search history.

(56) References Cited

U.S. PATENT DOCUMENTS

| 8,902,624 | B2 | 12/2014 | Watanabe | |
|---|---|---|---|---|
| 2011/0026288 | A1* | 2/2011 | Watanabe | G11C 15/00 365/49.17 |
| 2012/0262972 | A1* | 10/2012 | Watanabe | G11C 15/00 365/49.17 |
| 2015/0055390 | A1* | 2/2015 | Watanabe | G11C 15/00 365/49.17 |
| 2016/0005465 | A1* | 1/2016 | Watanabe | G11C 15/00 365/49.11 |
| 2016/0247569 | A1* | 8/2016 | Nii | G11C 15/04 |
| 2017/0062051 | A1* | 3/2017 | Watanabe | G11C 15/04 |

FOREIGN PATENT DOCUMENTS

JP    2013-101750 A    5/2013

* cited by examiner

*Primary Examiner* — Harry W Byrne
(74) *Attorney, Agent, or Firm* — McDermott Will & Emery LLP

(57) ABSTRACT

A semiconductor device is provided where high-speed search operation can be performed. The semiconductor device includes a plurality of search memory cells arranged in a matrix form a plurality of search line pairs which are respectively provided corresponding to memory cell columns and which respectively transmit a plurality of search data to be compared with data stored in the search memory cells, a plurality of search drivers which are respectively arranged at corresponding to one end sides of the search line pairs and which drive the search line pairs according to the search data, and a plurality of assist circuits which are respectively provided corresponding to the other end sides of the search line pairs and which assist driving corresponding search line pairs according to the search data.

19 Claims, 23 Drawing Sheets

| SRAM CELL (X CELL) | SRAM CELL (Y CELL) | TCAM CELL DATA |
|---|---|---|
| "1" | "0" | "0" |
| "0" | "1" | "1" |
| "0" | "0" | "*" (don't care) |
| "1" | "1" | NON-USE |

SEMICONDUCTOR DEVICE

CROSS-REFERENCE TO RELATED APPLICATIONS

The disclosure of Japanese Patent Application No. 2017-251723 filed on Dec. 27, 2017 including the specification, drawings and abstract is incorporated herein by reference in its entirety.

BACKGROUND

The present disclosure relates to a semiconductor device having memory cells.

A storage device called a search memory or CAM (Content Addressable Memory) searches for a data word coincident with a search word from among data words stored in the storage device, and when a coincident data word is found, the storage device outputs an address of the coincident data word.

The CAM includes BCAM (Binary CAM) and TCAM (Ternary CAM). Each memory cell of the BCAM stores information of "0" or "1". On the other hand, each memory cell of the TCAM can store information of "Don't Care" (in the present example, a symbol "*" is used for "Don't Care") in addition to "0" and "1". The symbol "*" indicates that any of "0" and "1" may be stored.

A TCAM device is widely used for address search and access control in a router for a network such as the Internet. To cope with increase in capacity, the TCAM device generally has a plurality of arrays, and a search operation is performed on each array at the same time.

The TCAM device can compare input search data (input packet) with TCAM cell data simultaneously, so that the TCAM device can perform the comparison quicker than when using a RAM (Random Access Memory) in all search usages.

Specifically, the TCAM device compares information stored in a memory cell with data which a user wants to search for, and a match line (ML) of the TCAM device indicates whether or not the information is coincident with the data.

Further, a configuration for outputting address information (Hit Index) corresponding to a match line indicating that the information is coincident with the data is provided (Japanese Unexamined Patent Application Publication No. 2013-101750).

SUMMARY

On the other hand, in recent years, the capacity of search memory is increased, and the length of a search line that transmits input search data tends to be long.

Therefore, there is a possibility that a difference in speed of transmitted data occurs between a memory cell close to a driver that drives the search line and a memory cell far from the driver.

The difference in speed affects high-speed search operation.

The present disclosure is made to solve the above problem and provides a semiconductor device where high-speed search operation can be performed.

Other objects and novel features will become apparent from the description of the present specification and the accompanying drawings.

A semiconductor device according to an aspect includes a plurality of search memory cells arranged in a matrix form, and a plurality of search line pairs which are respectively provided corresponding to memory cell columns and which respectively transmit a plurality of search data to be compared with data stored in the search memory cells. The semiconductor device further includes a plurality of search drivers which are respectively arranged at corresponding to one end sides of the search line pairs and which drive the search line pairs according to the search data, and a plurality of assist circuits which are respectively arranged at corresponding to the other end sides of the search line pairs and which assist driving corresponding search line pairs according to the search data.

According to an embodiment, the semiconductor device of the present disclosure can perform high-speed search operation.

DETAILED DESCRIPTION

Figure 1:
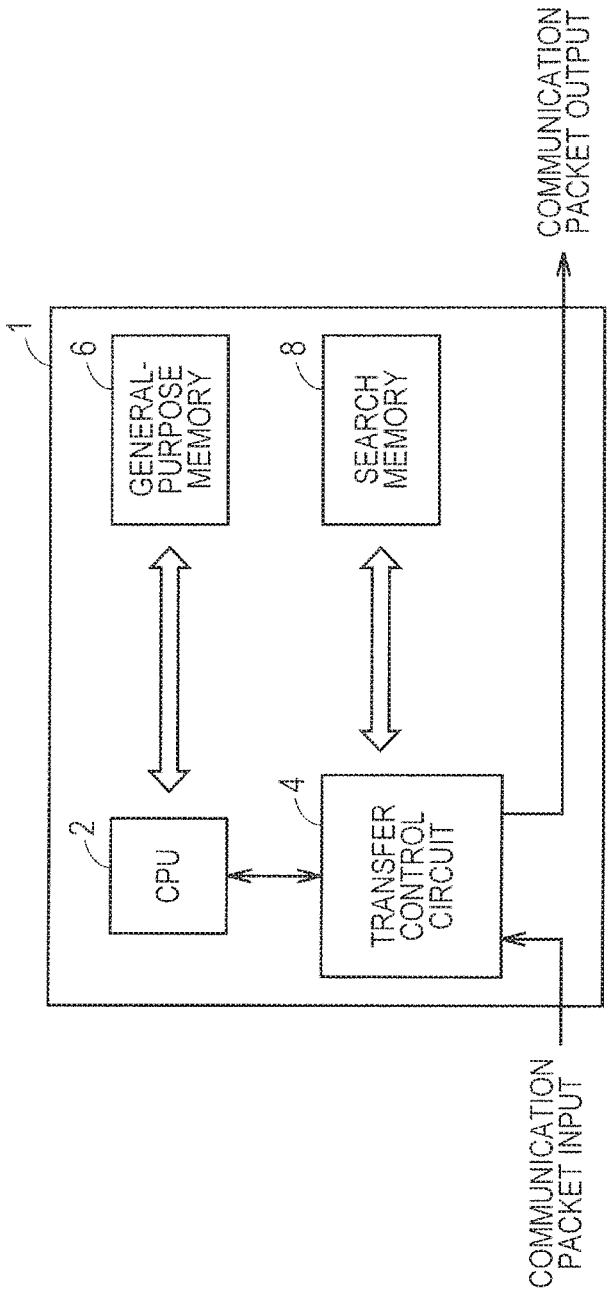
FIG. 1 is a diagram for explaining a configuration of a communication apparatus 1 based on a first embodiment.

Embodiments will be described in detail with reference to the drawings. The same or corresponding portions in the drawings are denoted by the same reference numerals, and the description thereof will not be repeated.

First Embodiment

<Entire Configuration of Communication Apparatus 1>

FIG. 1 is a diagram for explaining a configuration of a communication apparatus 1 based on a first embodiment.

As shown in FIG. 1, the communication apparatus 1 is a communication apparatus such as a switch or a router.

The communication apparatus 1 includes a CPU (Central Processing Unit) 2, a transfer control circuit 4, a general-purpose memory 6, and a search memory 8.

The CPU 2 controls the entire apparatus.

The CPU 2 realizes various functions in cooperation with a program stored in the general-purpose memory 6. For example, the general-purpose memory 6 can be composed of a DRAM (Dynamic Random Access Memory) and constructs an operating system (OS) by cooperating with the CPU 2. The CPU 2 exchanges information with an adjacent communication apparatus and the like, and maintains and manages information necessary for transfer processing.

The transfer control circuit 4 performs communication packet transfer processing. The transfer control circuit 4 is provided with dedicated hardware such as an ASIC (Application Specific Integrated Circuit) specialized for transfer processing or an NPU (Network Processing Unit). The transfer control circuit 4 accesses the search memory 8 and acquires information necessary for transfer processing.

In the present example, the search memory 8 will be described in a case where a TCAM device is used.

[Configuration of TCAM Cell]

Figures 2, 3:
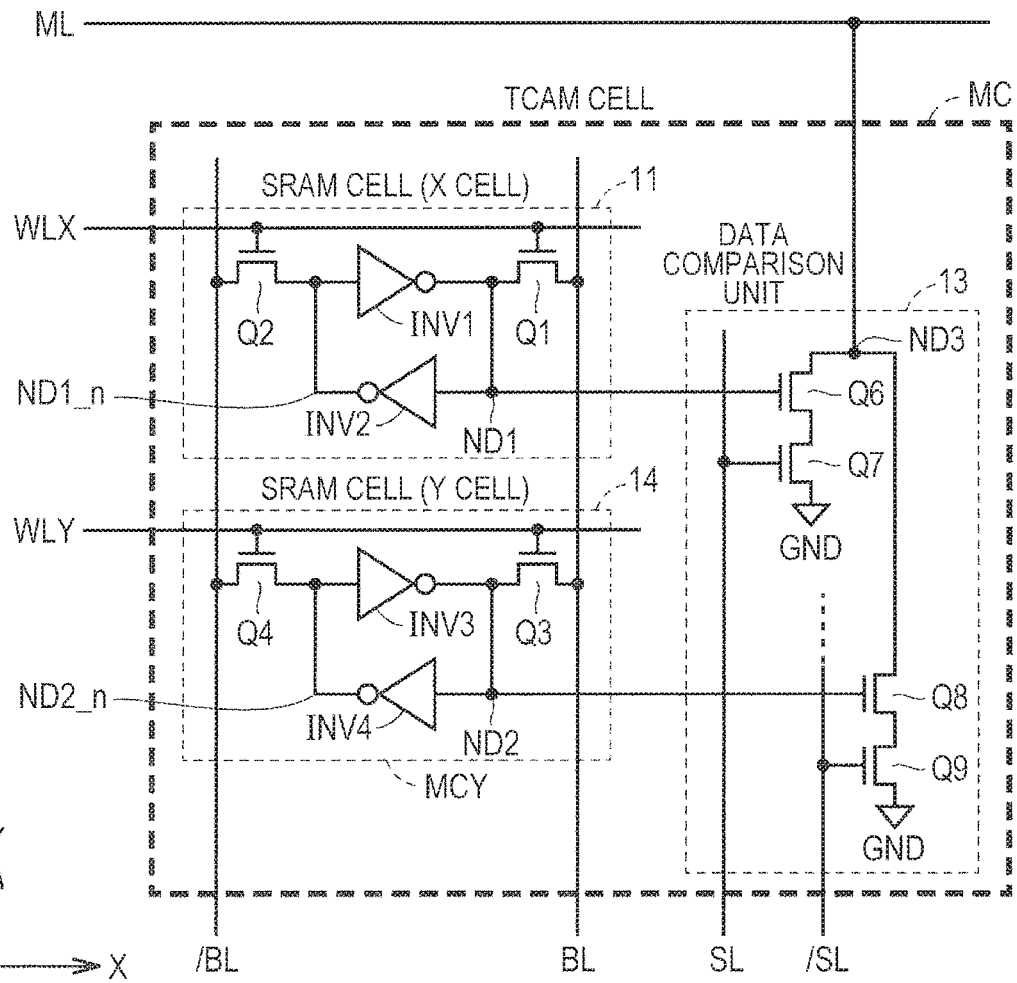
FIG. 2 is a circuit diagram showing an example of a configuration of a TCAM cell.
FIG. 3 is a diagram showing a correspondence relationship between storage contents in an X cell and a Y cell in FIG. 2 and TCAM data in a table format.

FIG. 2 is a circuit diagram showing an example of a configuration of the TCAM cell.

Referring to FIG. 2, the TCAM cell (also referred to as a memory cell MC) includes two SRAM cells (Static Random Access Memory Cells) 11 and 14 and a data comparison unit 13. The SRAM cell 11 is also referred to as an X cell, and the SRAM cell 14 is also referred to as a Y cell. The X cell 11 stores mutually complementary 1 bit data (when one 1 bit data is "1", the other 1 bit data is "0") in an internal storage node pair ND1 and ND1_n. The Y cell 14 stores mutually complementary 1 bit data in an internal storage node pair ND2 and ND2_n. The TCAM cell is also referred to as a search memory cell.

The TCAM cell is coupled with a bit line pair BL and /BL, a search line pair SL and /SL, a match line ML, and word lines WLX and WLY. The bit line pair BL and /BL extend in a column direction (Y direction) of a TCAM cell array 20 in FIG. 4 and are shared by a plurality of TCAM cells arranged in the column direction. The search line pair SL and /SL extend in the column direction (Y direction) of the TCAM cell array 20 and are shared by the plurality of TCAM cells arranged in the column direction.

The match line ML extends in a row direction (X direction) of the TCAM cell array 20 and are shared by a plurality of TCAM cells arranged in the row direction. The word lines WLX and WLY extend in the row direction (X direction) of the TCAM cell array 20 and are shared by the plurality of TCAM cells arranged in the row direction.

The X cell 11 includes inverters INV1 and INV2 and N-channel MOS (Metal Oxide Semiconductor) transistors Q1 and Q2. The inverter INV1 is coupled between a storage node ND1 and a storage node ND1_n so that a direction from the storage node ND1_n to the storage node ND1 is a forward direction. The inverter INV2 is coupled in parallel with but in the opposite direction to the inverter INV1. The MOS transistor Q1 is coupled between the storage node ND1 and the bit line BL. The MOS transistor Q2 is coupled between the storage node ND1_n and the bit line /BL. The gates of the MOS transistors Q1 and Q2 are coupled with the word line WLX.

The Y cell 14 includes inverters INV3 and INV4 and MOS (Metal Oxide Semiconductor) transistors Q3 and Q4. The inverter INV3 is coupled between a storage node ND2 and a storage node ND2_n so that a direction from the storage node ND2_n to the storage node ND2 is a forward direction. The inverter INV4 is coupled in parallel with but in the opposite direction to the inverter INV3. The MOS transistor Q3 is coupled between the storage node ND2 and the bit line BL. The MOS transistor Q4 is coupled between the storage node ND2_n and the bit line /BL. The gates of the MOS transistors Q3 and Q4 are coupled with the word line WLY.

The data comparison unit 13 includes N-channel MOS transistors Q6 to Q9. The MOS transistors Q6 and Q7 are serially coupled between a node ND3 that is a coupling point with the match line ML and a ground node GND. The MOS transistors Q8 and Q9 are serially coupled between the node ND3 and the ground node GND and are coupled in parallel with the entire MOS transistors Q6 and Q7 that are serially coupled. The gates of the MOS transistors Q6 and Q8 are coupled to the storage nodes ND1 and ND2, respectively. The gates of the MOS transistors Q7 and Q9 are coupled to the search lines SL and /SL, respectively.

FIG. 3 is a diagram showing a correspondence relationship between storage contents in the X cell and the Y cell in FIG. 2 and TCAM data in a table format.

Referring to FIGS. 2 and 3, the TCAM cell can store a ternary value "0", "1", or "*" (don't care) by using a 2-bit SRAM cell. Specifically, it is assumed that when "1" is stored in the storage node ND1 of the X cell 11 and "0" is stored in the storage node ND2 of the Y cell 14, "0" is stored in the TCAM cell. It is assumed that when "0" is stored in the storage node ND1 of the X cell 11 and "1" is stored in the storage node ND2 of the Y cell 14, "1" is stored in the TCAM cell. It is assumed that when "0" is stored in the storage node ND1 of the X cell 11 and "0" is stored in the storage node ND2 of the Y cell 14, "*" (don't care) is stored in the TCAM cell. When "1" is stored in the storage node ND1 of the X cell 11 and "1" is stored in the storage node ND2 of the Y cell 14, the TCAM cell is not used.

According to the configuration of the TCAM cell described above, when search data is "1" (that is, the search line SL is "1" and the search line /SL is "0") and the TCAM data is "0" (the storage node ND1 is "1" and the storage node ND2 is "0"), the MOS transistors Q6 and Q7 are ON state, so that potential of a pre-charged match line ML is lowered to the ground potential. When search data is "0" (that is, the search line SL is "0" and the search line /SL is "1") and the TCAM data is "1" (the storage node ND1 is "0" and the storage node ND2 is "1"), the MOS transistors Q8 and Q9 are ON state, so that the pre-charged potential of the match line ML is lowered to the ground potential. In other words, when the search data and the TCAM data are not coincident with each other, the potential of the match line ML is lowered to the ground potential.

On the other hand, when the inputted search data is "1" and the TCAM data is "1" or "*", or when the search data is "0" and the TCAM data is "0" or "*" (that is, when the search data and the TCAM data are coincident with each other), the potential (power supply voltage VDD level) of the pre-charged match line ML is maintained.

As described above, in the TCAM, charges stored in the match line ML are discharged as long as data of all the TCAM cells coupled to the match line ML corresponding to one entry (row) are not coincident with the inputted search data. Therefore, there is a problem that search in the TCAM consumes large current although the search is quickly performed.

Figure 4:
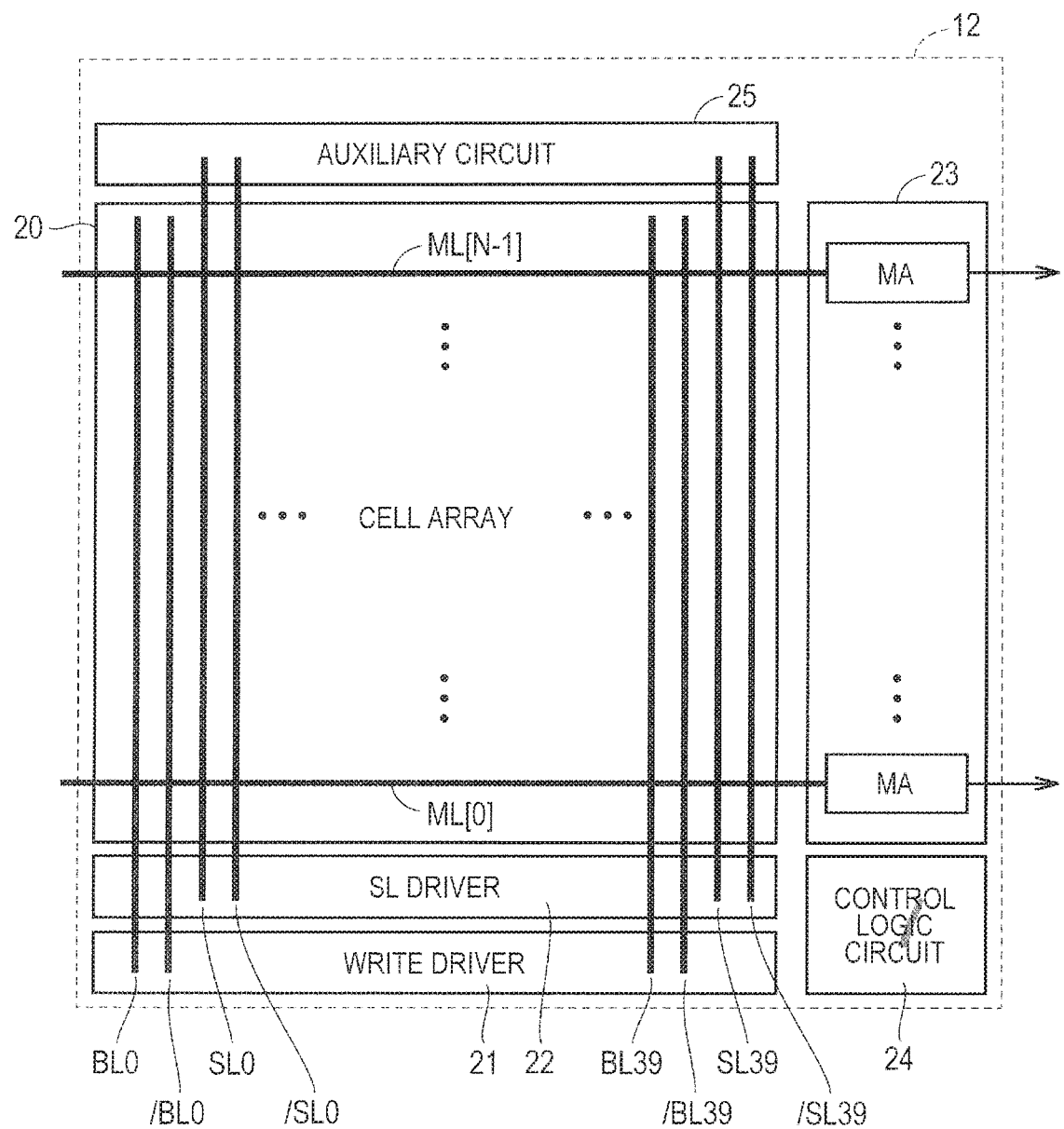
FIG. 4 is a diagram for explaining a configuration of a segment (sub-block) 12 included in a search memory 8 based on the first embodiment.

FIG. 4 is a diagram for explaining a configuration of a segment (sub-block) 12 included in the search memory 8 based on the first embodiment.

As shown in FIG. 4, the segment 12 includes the TCAM cell array 20 (also simply referred to as a cell array), a write driver group 21, a search line driver group 22, a match amplifier unit 23, a control logic circuit 24, and an assist circuit group 25.

Although not shown in FIG. 4, the segment 12 includes a word line driver (not shown in FIG. 4) for driving the word lines WLX and WLY and an input/output circuit (not shown in FIG. 4) that receives input of a control signal, an address signal, and the like.

The TCAM cell array 20 includes TCAM cells arranged in a matrix form (m rows; k columns). In the present example, a case is shown in which the number of rows (the number of entries) m is N and the number of columns (the number of bits) k is 40 in the cell array 20. The cell array 20 has at least one redundant memory cell column.

Corresponding to each column of the cell array 20, k (k=40) bit line pairs (from BL0 and /BL0 to BL (k−1) and /BL (k−1)) and k (k=40) search line pairs (from SL0 and /SL0 to SL (k−1) and /SL (k−1)) are provided.

Corresponding to each row of the cell array 20, m (m=N) match lines (from ML0 to ML (N−1)), m X cell word lines (from WLXO to WLX (N−1)) not shown in FIG. 4, and m Y cell word lines (from WLYO to WLY(N−1)) not shown in FIG. 4 are provided.

When writing, the write driver group 21 supplies write data to each TCAM cell through the bit line pair BL and /BL. When searching, the search line driver group 22 supplies search data to each TCAM cell through the search line pair SL and /SL.

The control logic circuit 24 controls operation of the entire segment 12. For example, when searching, the control logic circuit 24 controls operations of the search line driver group 22, the match amplifier unit 23, and a precharge circuit by receiving a search command and outputting a control signal to the search line driver group 22 and the match amplifier unit 23.

The assist circuit group 25 that assists driving the search lines is provided on the opposite side of the search line driver group 22.

The match amplifier unit 23 includes a plurality of match amplifiers MA respectively corresponding to the rows of the cell array. The match amplifier MA detects whether or not corresponding TCAM cell data and a corresponding portion of input search data are coincident with each other based on a potential of a corresponding match line ML when searching. In this embodiment, the match amplifier MA includes a precharge circuit for pre-charging a corresponding match line ML when searching.

Figure 5:
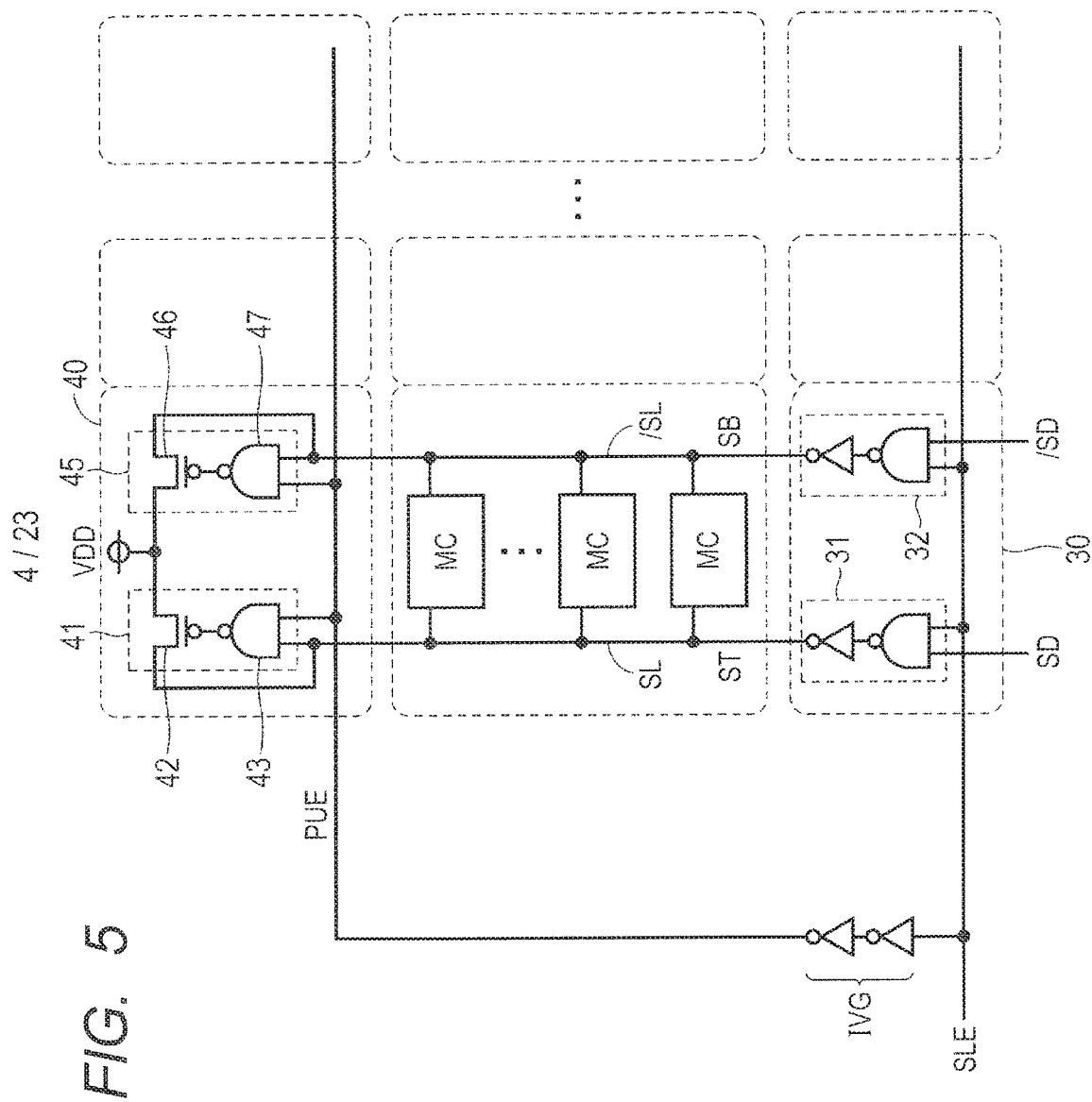
FIG. 5 is a diagram for explaining a configuration of a search line driver group 22 and an assist circuit group 25 based on the first embodiment.

FIG. 5 is a diagram for explaining a configuration of the search line driver group 22 and the assist circuit group 25 based on the first embodiment.

Referring to FIG. 5, a search line driver 30 provided for each memory cell column and an assist circuit 40 provided for each memory cell column are shown.

The search line driver 30 will be described.

The search line driver 30 is arranged at one end sides of the search lines SL and /SL.

The search line driver 30 includes search line driver units 31 and 32.

The search line driver unit 31 includes an inverter and a NAND circuit.

The NAND circuit outputs a NAND logical operation result of search data SD and a control signal SLE. The inverter outputs an inverted signal of the output of the NAND circuit as data ST.

The search line driver unit 32 includes an inverter and a NAND circuit.

The NAND circuit outputs a NAND logical operation result of search data /SD that is an inverted signal of the search data SD and the control signal SLE. The inverter outputs an inverted signal of the output of the NAND circuit as data SB.

One of the search line driver units 31 and 32 drives one of the search lines SL and /SL as data ST or SB ("H" level) based on inputs of the search data SD and /SD and the control signal SLE.

For example, when the control signal SLE is "H" level and the search data SD and /SD are "H" level and "L" level, respectively, the data ST becomes "H" level.

On the other hand, when the control signal SLE is "H" level and the search data SD and /SD are "L" level and "H" level, respectively, the data SB becomes "H" level.

Next, the assist circuit 40 will be described.

The assist circuit 40 is provided on the other end sides of the search lines SL and /SL.

The control signal SLE is inputted into the assist circuit group 25 as a control signal PUE according to an inverter group IVG.

The assist circuit 40 includes assist units 41 and 45.

The assist unit 41 includes a P-channel MOS transistor 42 and a NAND circuit 43.

The NAND circuit 43 outputs a NAND logical operation result of the control signal PUE and the data ST to the gate of the P-channel MOS transistor 42.

The P-channel MOS transistor 42 is provided between the power supply voltage VDD and the search line SL, and the gate of the P-channel MOS transistor 42 receives an input from the NAND circuit 43.

The assist unit 45 includes a P-channel MOS transistor 46 and a NAND circuit 47.

The NAND circuit 47 outputs a NAND logical operation result of the control signal PUE and the data SB to the gate of the P-channel MOS transistor 46.

The P-channel MOS transistor 46 is provided between the power supply voltage VDD and the search line /SL, and the gate of the P-channel MOS transistor 46 receives an input from the NAND circuit 46.

One of the assist units 41 and 45 redrives one of the search lines SL and /SL at the same logic level based on inputs of the data ST and SB and the control signal PUE.

For example, when the control signal PUE is "H" level and the data ST and SB are "H" level and "L" level, respectively, the P-channel MOS transistor 42 turns on. Thereby, the other end side of the search line SL is coupled to the power supply voltage VDD.

On the other hand, when the control signal PUE is "H" level and the data ST and SB are "L" level and "H" level, respectively, the P-channel MOS transistor 46 turns on. Thereby, the other end side of the search line /SL is coupled to the power supply voltage VDD.

Therefore, the assist circuit 40 redrives the other end sides of the search lines SL and /SL from the other end sides by a driver.

Figure 6:
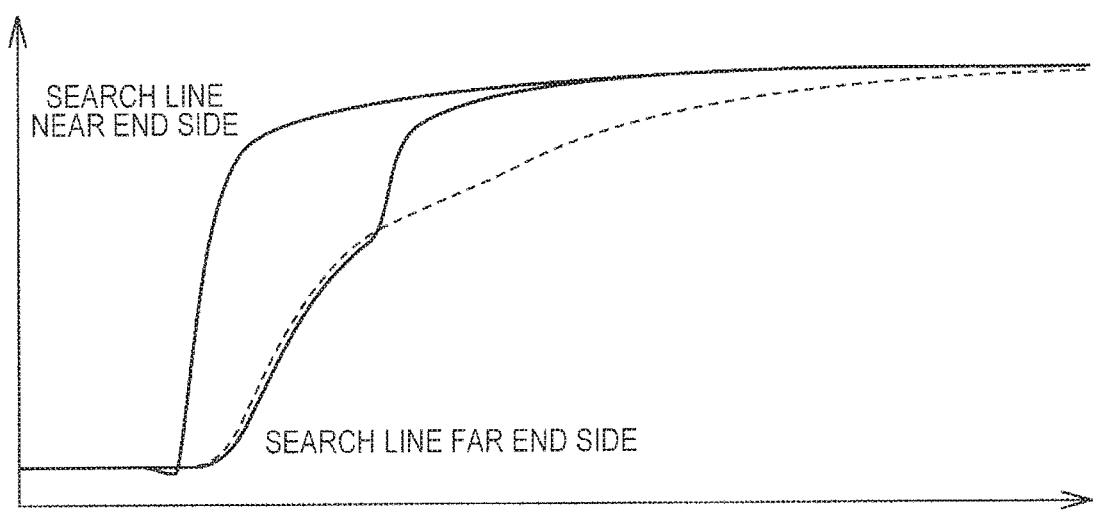
FIG. 6 is a diagram for explaining a potential state of a search line based on the first embodiment.

FIG. 6 is a diagram for explaining a potential state of a search line based on the first embodiment.

As shown in FIG. 6, regarding the potential state of the search line, the potential of a search line near end side rises to "H" level relatively quickly because the search line near end side is close to a driver.

On the other hand, it takes time for the potential of a search line far end side to rise to "H" level. This may prevent a search operation from being performed quickly.

In the present example, a driver is provided on the search line far end side, and the search line far end side is driven at the same logic level, so that the potential of the search line far end side can be quickly raised to "H" level.

Thereby, it is possible to accelerate the search operation.

Modified Example

Figure 7:
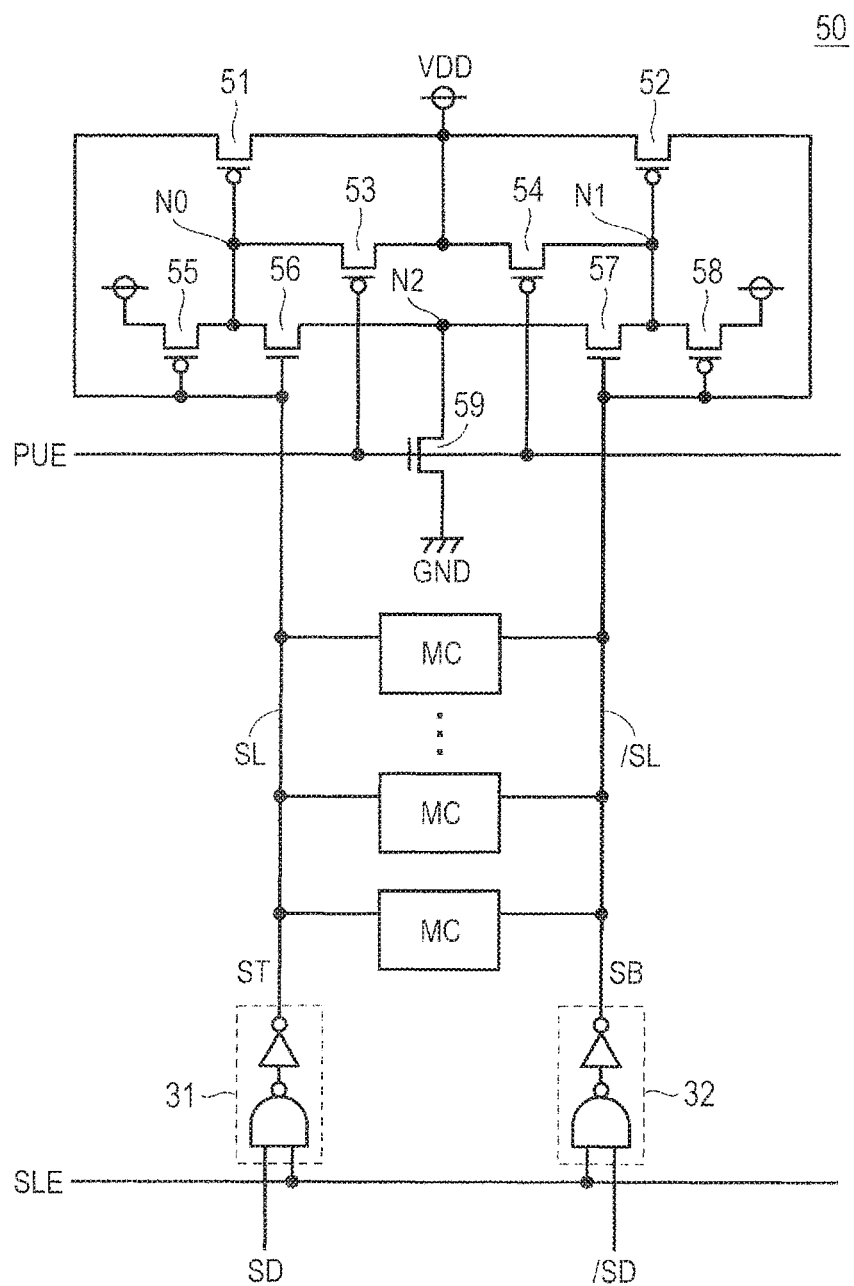
FIG. 7 is a diagram for explaining a configuration of an assist circuit 50 based on a modified example of the first embodiment.

FIG. 7 is a diagram for explaining a configuration of an assist circuit 50 based on a modified example of the first embodiment.

Referring to FIG. 7, the assist circuit 50 in FIG. 7 is different from the assist circuit 40 described in FIG. 5 in that a circuit configuration of the NAND circuits 43 and 47 is simplified.

Specifically, the assist circuit 50 includes P-channel MOS transistors 51 to 55 and 58 and N-channel MOS transistors 56, 57, and 59.

One end side of the P-channel MOS transistor 51 is coupled to the power supply voltage VDD, the other end side is coupled to the search line SL, and the gate is coupled to a node N0.

One end side of the P-channel MOS transistor 55 is coupled to the power supply voltage VDD, the other end side is coupled to the node N0, and the gate is coupled to the search line SL.

One end side of the N-channel MOS transistor 56 is coupled to the Node N0, the other end side is coupled to a node N2, and the gate is coupled to the search line SL.

One end side of the P-channel MOS transistor 53 is coupled to the Node N0, the other end side is coupled to the power supply voltage VDD, and the gate receives input of the control signal PUE.

One end side of the P-channel MOS transistor 54 is coupled to the power supply voltage VDD, the other end side is coupled to a node N1, and the gate receives input of the control signal PUE.

One end side of the N-channel MOS transistor 59 is coupled to the Node N2, the other end side is coupled to a ground voltage GND, and the gate receives input of the control signal PUE.

One end side of the N-channel MOS transistor 57 is coupled to the Node N2, the other end side is coupled to the node N1, and the gate is coupled to the search line /SL.

One end side of the P-channel MOS transistor 58 is coupled to the power supply voltage VDD, the other end side is coupled to the node N1, and the gate is coupled to the search line /SL.

One end side of the P-channel MOS transistor 52 is coupled to the power supply voltage VDD, the other end side is coupled to the search line /SL, and the gate is coupled to the node N1.

The assist circuit 50 redrives one of the search lines SL and /SL at the same logic level based on inputs of the data ST and SB and the control signal PUE.

For example, when the control signal PUE is "H" level and the data ST and SB are "H" level and "L" level, respectively, the N-channel MOS transistors 56 and 59 turn on. Accordingly, the P-channel MOS transistor 51 turns on. Thereby, the other end side of the search line SL is coupled to the power supply voltage VDD.

On the other hand, when the control signal PUE is "H" level and the data ST and SB are "L" level and "H" level, respectively, the P-channel MOS transistors 57 and 59 turn on. Accordingly, the P-channel MOS transistor 52 turns on. Thereby, the other end side of the search line /SL is coupled to the power supply voltage VDD.

Therefore, the assist circuit 50 redrives the search lines SL and /SL by a driver from the other end sides.

Second Embodiment

In the first embodiment described above, a case is described where the assist circuit is operated by using the control signal PUE.

On the other hand, the control signal PUE need not necessarily be used.

Figure 8A:
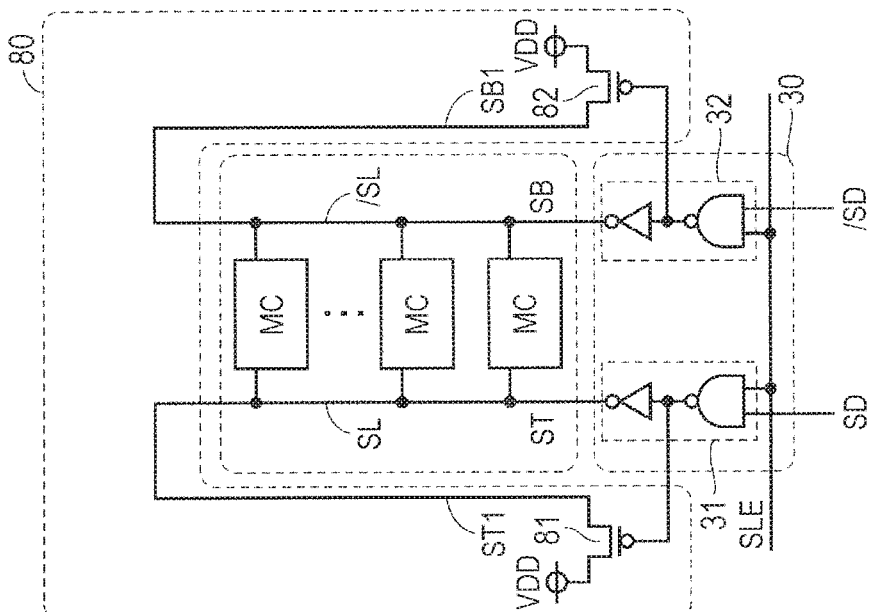
FIGS. 8A, 8B and 8C are diagrams for explaining a configuration of an assist circuit based on a second embodiment.
Figure 8B:
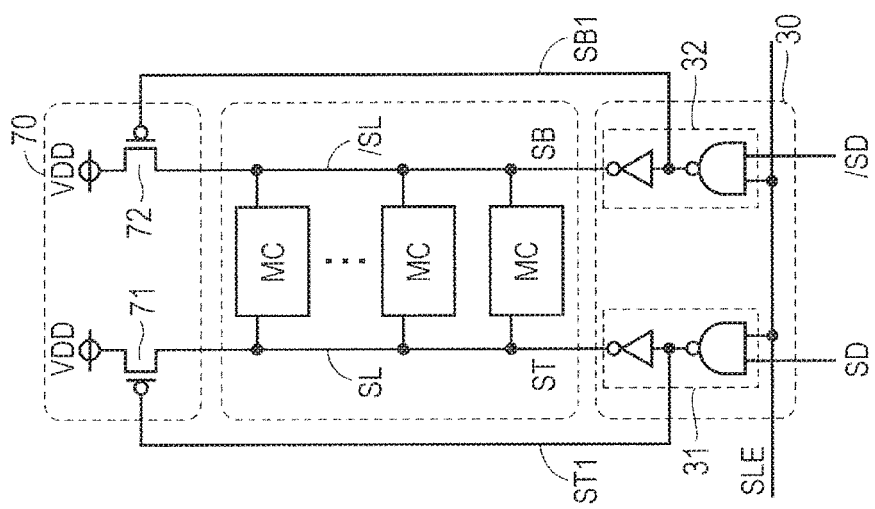
Figure 8C:
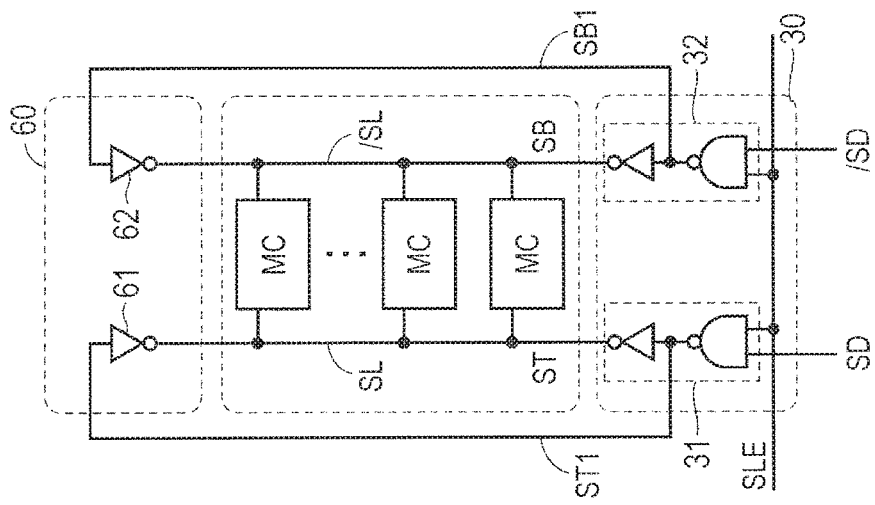

FIGS. 8A, 8B, and 8C are diagrams for explaining a configuration of an assist circuit based on a second embodiment.

Referring to FIG. 8A, an assist circuit 60 includes inverters 61 and 62 provided on the other end sides of the search lines SL and /SL.

Further, signal wirings ST1 and SB1 are provided.

The signal wiring ST1 transmits an output signal of a NAND circuit of a search line driver unit 31 to the inverter 61.

The signal wiring SB1 transmits an output signal of a NAND circuit of a search line driver unit 32 to the inverter 62.

In the configuration, the NAND circuit of one of the search line driver units 31 and 32 outputs "L" level based on inputs of the search data SD and /SD and the control signal SLE and drives one of the search lines SL and /SL as data ST or SB ("H" level).

For example, when the control signal SLE is "H" level and the search data SD and /SD are "H" level and "L" level, respectively, "L" level is outputted from the NAND circuit of the search line driver unit 31 and the data ST becomes "H" level.

On the other hand, when the control signal SLE is "H" level and the search data SD and /SD are "L" level and "H" level, respectively, "L" level is outputted from the NAND circuit of the search line driver unit 32 and the data SB becomes "H" level.

In the configuration, the assist circuit 60 receives "L" level signals of the NAND circuits of the search line driver units 31 and 32 and drives the inverters 61 and 62.

For example, when the NAND circuit of the search line driver unit 31 outputs "L" level, the other end side of the search line SL is coupled to the power supply voltage VDD by the inverter 61.

On the other hand, when the NAND circuit of the search line driver unit 32 outputs "L" level, the other end side of the search line/SL is coupled to the power supply voltage VDD by the inverter 62.

Therefore, the assist circuit 60 redrives the search lines SL and /SL by a driver from the other end sides.

Therefore, it is possible to realize the assist circuit 60 by a simple circuit configuration.

Referring to FIG. 8B, an assist circuit 70 includes P-channel MOS transistors 71 and 72.

Further, signal wirings ST1 and SB1 are provided.

The P-channel MOS transistor 71 is provided between the power supply voltage VDD and the search line SL, and the gate of the P-channel MOS transistor 71 is coupled to the signal wiring ST1.

The P-channel MOS transistor 72 is provided between the power supply voltage VDD and the search line/SL, and the gate of the P-channel MOS transistor 72 is coupled to the signal wiring SB1.

The signal wiring ST1 transmits the output signal of the NAND circuit of the search line driver unit 31 to the gate of the P-channel MOS transistor 71.

The signal wiring SB1 transmits the output signal of the NAND circuit of the search line driver unit 32 to the gate of the P-channel MOS transistor 72.

In the configuration, the NAND circuit of one of the search line driver units 31 and 32 outputs "L" level based on inputs of the search data SD and /SD and the control signal SLE and drives one of the search lines SL and /SL as data ST or SB ("H" level).

For example, when the control signal SLE is "H" level and the search data SD and /SD are "H" level and "L" level, respectively, "L" level is outputted from the NAND circuit of the search line driver unit 31 and the data ST becomes "H" level.

On the other hand, when the control signal SLE is "H" level and the search data SD and /SD are "L" level and "H" level, respectively, "L" level is outputted from the NAND circuit of the search line driver unit 32 and the data SB becomes "H" level.

In the configuration, the assist circuit 70 receives "L" level signals of the NAND circuits of the search line driver units 31 and 32 and turns on one of the P-channel MOS transistors 71 and 72.

For example, when the NAND circuit of the search line driver unit 31 outputs "L" level, the P-channel MOS transistor 71 turns on. Thereby, the other end side of the search line SL is coupled with the power supply voltage VDD.

On the other hand, when the NAND circuit of the search line driver unit 32 outputs "L" level, the P-channel MOS transistor 72 turns on. Thereby, the other end side of the search line/SL is coupled with the power supply voltage VDD.

Therefore, the assist circuit 70 redrives the search lines SL and /SL by a driver from the other end sides.

Therefore, it is possible to realize the assist circuit 70 by a simpler circuit configuration.

Referring to FIG. 8C, an assist circuit 80 includes P-channel MOS transistors 81 and 82.

Further, signal wirings ST1 and SB1 are provided.

The P-channel MOS transistors are configured to be arranged closer to the search line drivers as compared with FIG. 8B. The signal wirings ST1 and SB1 are configured to be coupled to the search lines SL and /SL, respectively.

The P-channel MOS transistor 81 is provided between the power supply voltage VDD and the signal wiring ST1, and the gate of the P-channel MOS transistor 81 receives an input of an output signal of a NAND circuit.

The P-channel MOS transistor 82 is provided between the power supply voltage VDD and the signal wiring SB1, and the gate of the P-channel MOS transistor 82 receives an input of an output signal of a NAND circuit.

In the above configuration, the NAND circuit of one of the search line driver units 31 and 32 outputs "L" level based on inputs of the search data SD and /SD and the control signal SLE and drives one of the search lines SL and /SL as data ST or SB ("H" level).

For example, when the control signal SLE is "H" level and the search data SD and /SD are "H" level and "L" level, respectively, "L" level is outputted from the NAND circuit of the search line driver unit 31 and the data ST becomes "H" level.

On the other hand, when the control signal SLE is "H" level and the search data SD and /SD are "L" level and "H" level, respectively, "L" level is outputted from the NAND circuit of the search line driver unit 32 and the data SB becomes "H" level.

In the configuration, the assist circuit 80 receives "L" level signals of the NAND circuits of the search line driver units 31 and 32 and turns on one of the P-channel MOS transistors 81 and 82.

For example, when the NAND circuit of the search line driver unit 31 outputs "L" level, the P-channel MOS transistor 81 turns on. Thereby, the other end side of the search line SL is coupled with the power supply voltage VDD.

On the other hand, when the NAND circuit of the search line driver unit 32 outputs "L" level, the P-channel MOS transistor 82 turns on. Thereby, the other end side of the search line/SL is coupled with the power supply voltage VDD.

Therefore, the assist circuit 80 redrives the search lines SL and /SL by a driver from the other end sides.

Therefore, it is possible to realize the assist circuit 80 by a simple circuit configuration and it is also possible to facilitate circuit design by arranging the layout of the assist circuit 80 close to the search line drivers.

Figure 9A:
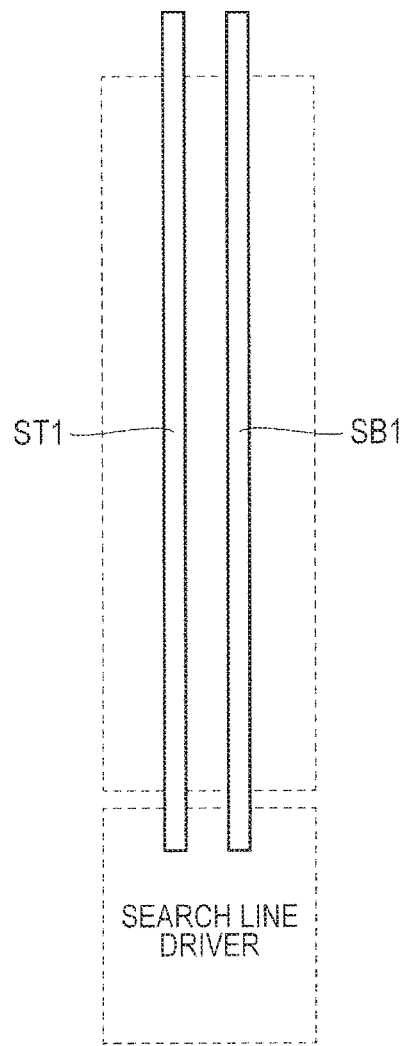
FIGS. 9A and 9B are diagrams for explaining a layout configuration according to the second embodiment.
Figure 9B:
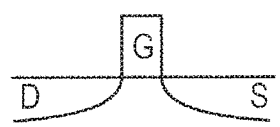

FIGS. 9A and 9B are diagrams for explaining a layout configuration according to the second embodiment.

As shown in FIG. 9A, the signal wirings ST1 and SB1 are arranged in parallel with the search line pair.

As shown in FIG. 9B, a transistor is formed in the lowest layer, and the search lines SL and /SL are formed over the transistor. Further, the match line ML is formed over the search lines SL and /SL. Furthermore, the signal wirings ST1 and SB1 are formed over the match line ML.

Third Embodiment

In the first and the second embodiments described above, a method is described that accelerates the search operation by providing an assist circuit that drives the other end sides.

On the other hand, it is also possible to accelerates the search operation by driving the search lines SL and /SL by a voltage raised higher than a normal power supply voltage.

Figure 10:
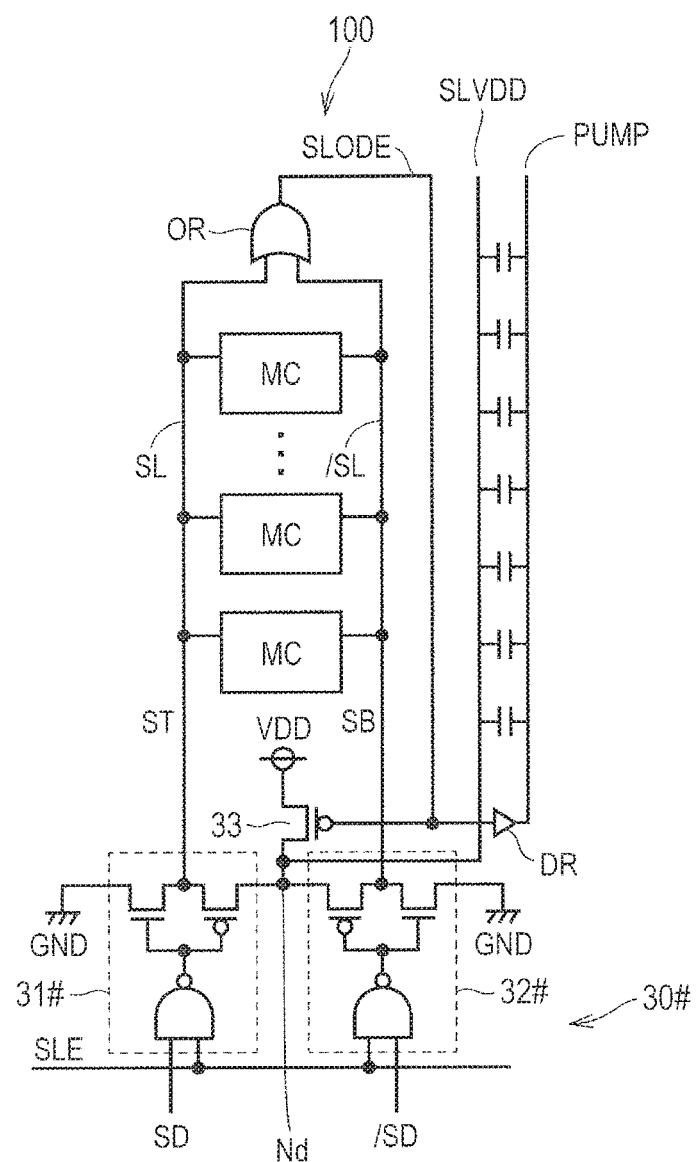
FIG. 10 is a diagram for explaining a configuration of a search line driver 30# and an assist circuit 100 based on a third embodiment.

FIG. 10 is a diagram for explaining a configuration of a search line driver 30# and an assist circuit 100 based on a third embodiment.

Referring to FIG. 10, the search line driver 30# is different from the search line driver 30 in a configuration of inverters.

Specifically, the search line driver 30# includes search line driver units 31# and 32# and a P-channel MOS transistor 33.

The P-channel MOS transistor 33 is provided between the power supply voltage VDD and a power supply node Nd. The gate is coupled with a signal wiring SLODE.

The power supply node Nd is coupled with the inverters of the search line driver units 31# and 32#.

The assist circuit 100 includes an OR circuit OR, the signal wiring SLODE, a sub power supply wiring SLVDD, a signal wiring PUMP, and a driver DR.

The OR circuit OR is coupled with the search lines SL and /SL and outputs an OR logical operation result to the signal wiring SLODE.

The sub power supply wiring SLVDD is coupled with the power supply node Nd.

The signal wiring SLODE, the sub power supply wiring SLVDD, and the signal wiring PUMP are arranged in parallel with each other.

In an initial state, the OR circuit OR outputs the signal wiring SLODE as "L" level.

Therefore, the P-channel MOS transistor 33 is on. Therefore, the power supply node Nd is coupled with the power supply voltage VDD.

In the above configuration, the NAND circuit of one of the search line driver units 31# and 32# outputs "L" level based on inputs of the search data SD and /SD and the control signal SLE and drives one of the search lines SL and /SL as data ST or SB ("H" level).

For example, when the control signal SLE is "H" level and the search data SD and /SD are "H" level and "L" level, respectively, "L" level is outputted from the NAND circuit of the search line driver unit 31# and the data ST becomes "H" level.

On the other hand, when the control signal SLE is "H" level and the search data SD and /SD are "L" level and "H" level, respectively, "L" level is outputted from the NAND circuit of the search line driver unit 32# and the data SB becomes "H" level.

The OR circuit OR receives data SB and ST and sets the signal wiring SLODE to "H" level.

Accordingly, the P-channel MOS transistor 33 turns off.

Therefore, the sub power supply wiring that is coupled with the power supply node Nd becomes a high impedance state.

Then, the driver DR drives the signal wiring PUMP according to a signal transmitted to the signal wiring SLODE.

Thereby, the signal wiring PUMP is driven to "H" level, so that a voltage level of the sub power supply wiring SLVDD is raised from the power supply voltage VDD according to an inter-wiring capacitance between the signal wiring PUMP and the sub power supply wiring SLVDD.

The search line driver units 31# and 32# drive one of the search lines SL and /SL by the raised voltage.

By the above configuration, the search lines SL and /SL are driven by a voltage raised from the normal power supply voltage, so that it is possible to accelerate the search operation.

Figure 11A:
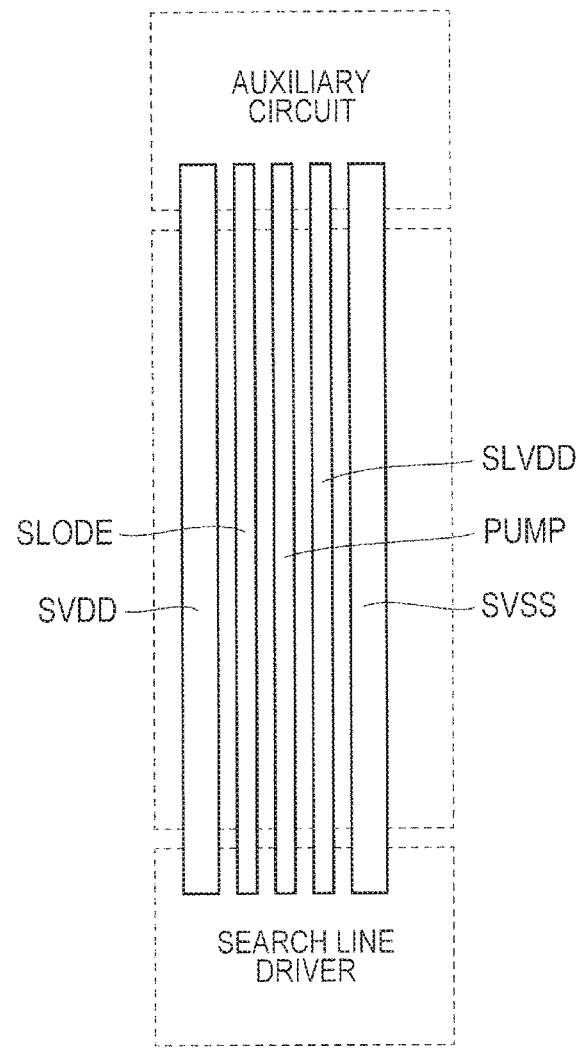
FIGS. 11A and 11B are diagrams for explaining a layout configuration of signal wirings according to the third embodiment.
Figure 11B:
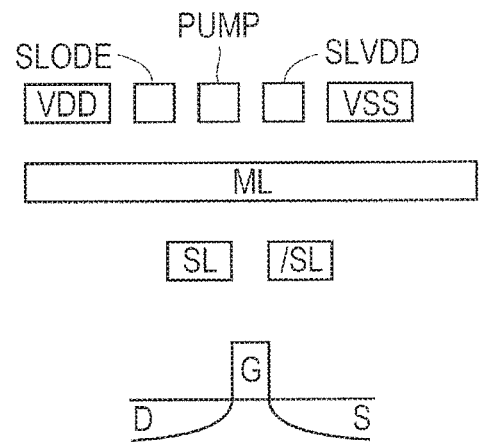

FIGS. 11A and 11B are diagrams for explaining a layout configuration of signal wirings according to the third embodiment.

As shown in FIG. 11A, the signal wirings SLODE and PUMP, the sub power supply wiring SLVDD, a power supply wiring SVDD to which the power supply voltage VDD is supplied, and a ground wiring SVSS to which the ground voltage GND is supplied are shown.

Here, the signal wirings SLODE and PUMP, the sub power supply wiring SLVDD, the power supply wiring SVDD to which the power supply voltage VDD is supplied, and the ground wiring SVSS to which the ground voltage GND is supplied are arranged in parallel with each other.

As shown in FIG. 11B, a transistor is formed in the lowest layer, and the search lines SL and /SL are formed over the transistor. Further, the match line ML is formed over the search lines SL and /SL. Furthermore, the signal wirings SLODE and PUMP, the sub power supply wiring SLVDD, the power supply wiring SVDD, and the ground wiring SVSS are formed over the match line ML.

Figure 12:
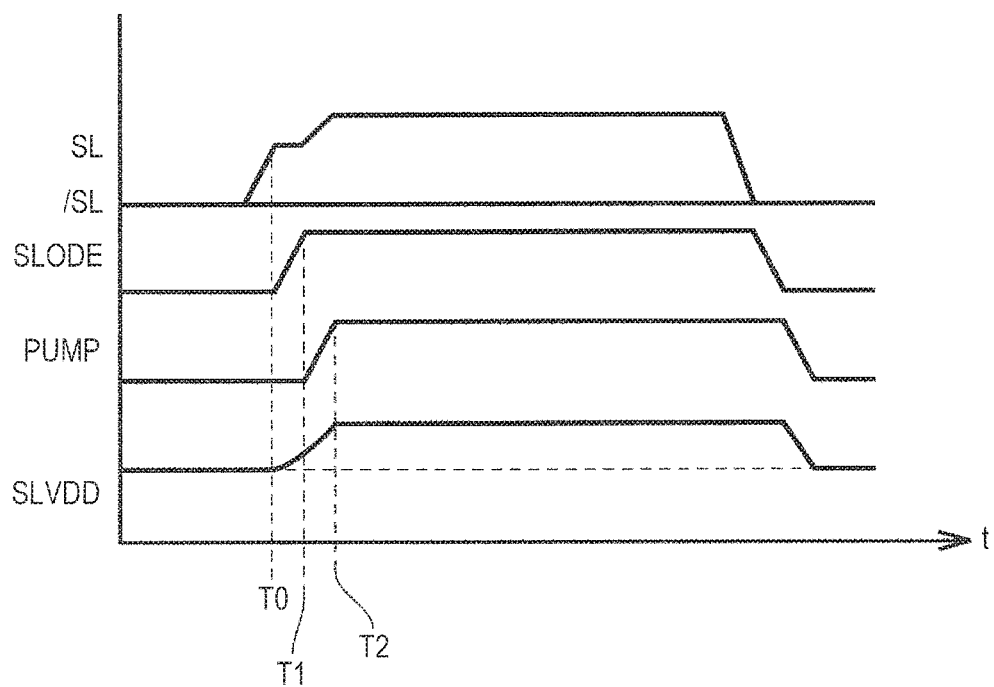
FIG. 12 is a timing chart for explaining an operation of the assist circuit 100 based on the third embodiment.

FIG. 12 is a timing chart for explaining an operation of the assist circuit 100 based on the third embodiment.

Referring to FIG. 12, a case is shown where the search line SL is set to "H" level at time T0. Then, the signal wiring SLODE rises at time T1. Thereby, the sub power supply wiring SLVDD becomes a high impedance state. Further, the signal wiring PUMP is driven to "H" level by the driver DR. Therefore, the voltage level of the sub power supply wiring SLVDD rises according to an inter-wiring capacitance. A case is shown where the voltage level of the search line SL further rises at time T2.

Thereby, it is possible to accelerate the search operation.

Modified Example

Figure 13:
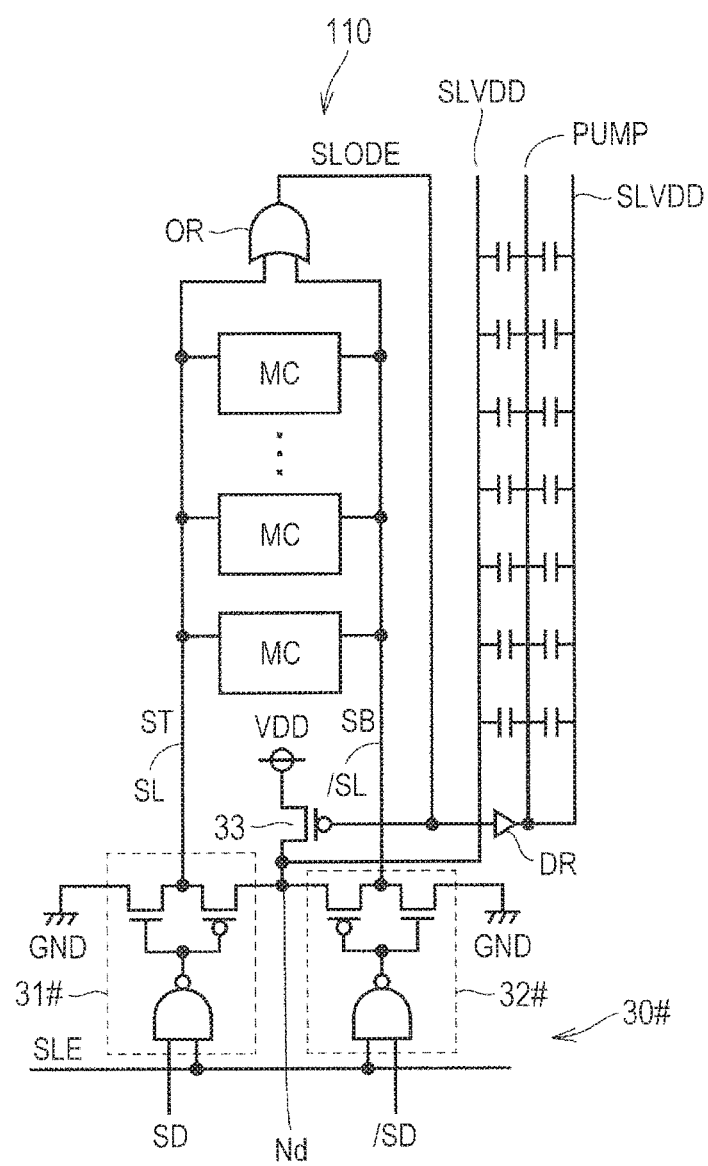
FIG. 13 is a diagram for explaining a configuration of a search line driver 30# and an assist circuit 110 based on a modified example of the third embodiment.

FIG. 13 is a diagram for explaining a configuration of a search line driver 30# and an assist circuit 110 based on a modified example of the third embodiment.

Referring to FIG. 13, the assist circuit 110 is different from the assist circuit 100 in FIG. 10 in that the sub power supply wiring SLVDD is added to the assist circuit 110. The other configurations are the same as those described in FIG. 10, so that the detailed description thereof will not be repeated.

Figure 14A:
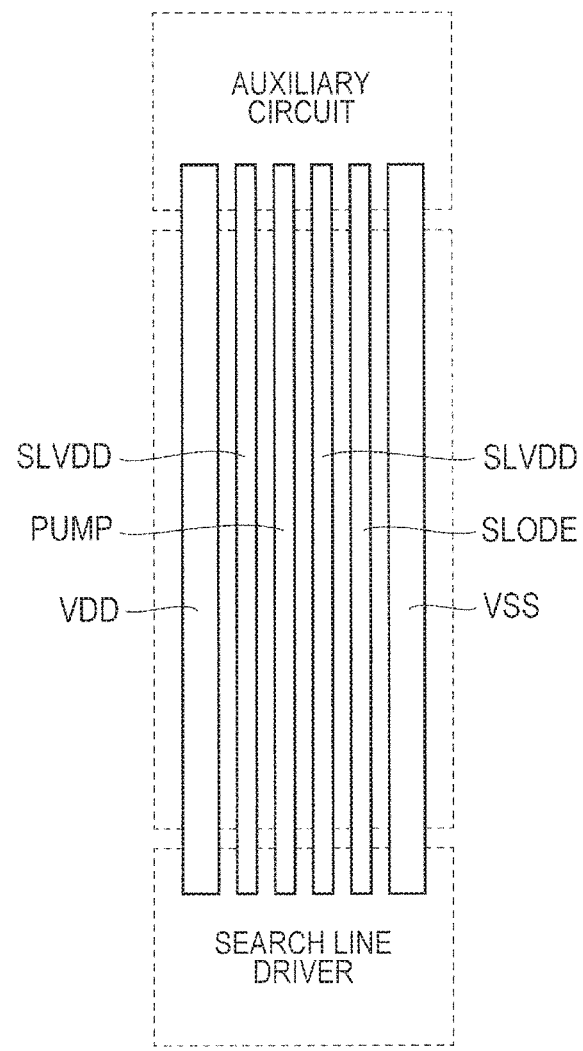
FIGS. 14A and 14B are diagrams for explaining a layout configuration of signal wirings according to the modified example of the third embodiment.
Figure 14B:
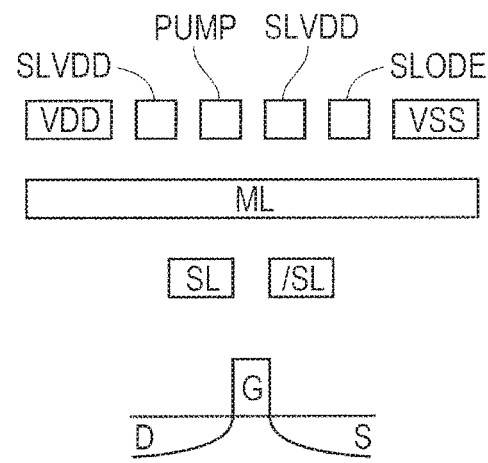

FIGS. 14A and 14B are diagrams for explaining a layout configuration of signal wirings according to the modified example of the third embodiment.

As shown in FIG. 14A, the signal wirings SLODE and PUMP, the sub power supply wirings SLVDD, the power supply wiring SVDD to which the power supply voltage VDD is supplied, and the ground wiring SVSS to which the ground voltage GND is supplied are shown.

Here, the signal wirings SLODE and PUMP, the two sub power supply wirings SLVDD, the power supply wiring SVDD to which the power supply voltage VDD is supplied, and the ground wiring SVSS to which the ground voltage GND is supplied are arranged in parallel with each other.

As shown in FIG. 14B, a transistor is formed in the lowest layer, and the search lines SL and /SL are formed over the transistor. Further, the match line ML is formed over the search lines SL and /SL. Furthermore, the signal wirings SLODE and PUMP, the two sub power supply wirings SLVDD, the power supply wiring SVDD, and the ground wiring SVSS are formed over the match line ML.

The signal wiring PUMP is arranged between the two sub power supply wirings SLVDD. When the signal wiring PUMP is driven by the driver DR, the voltage of the two sub power supply wirings SLVDD is raised. Thereby, it is possible to further raise the voltage level to be raised.

Fourth Embodiment

Figure 15:
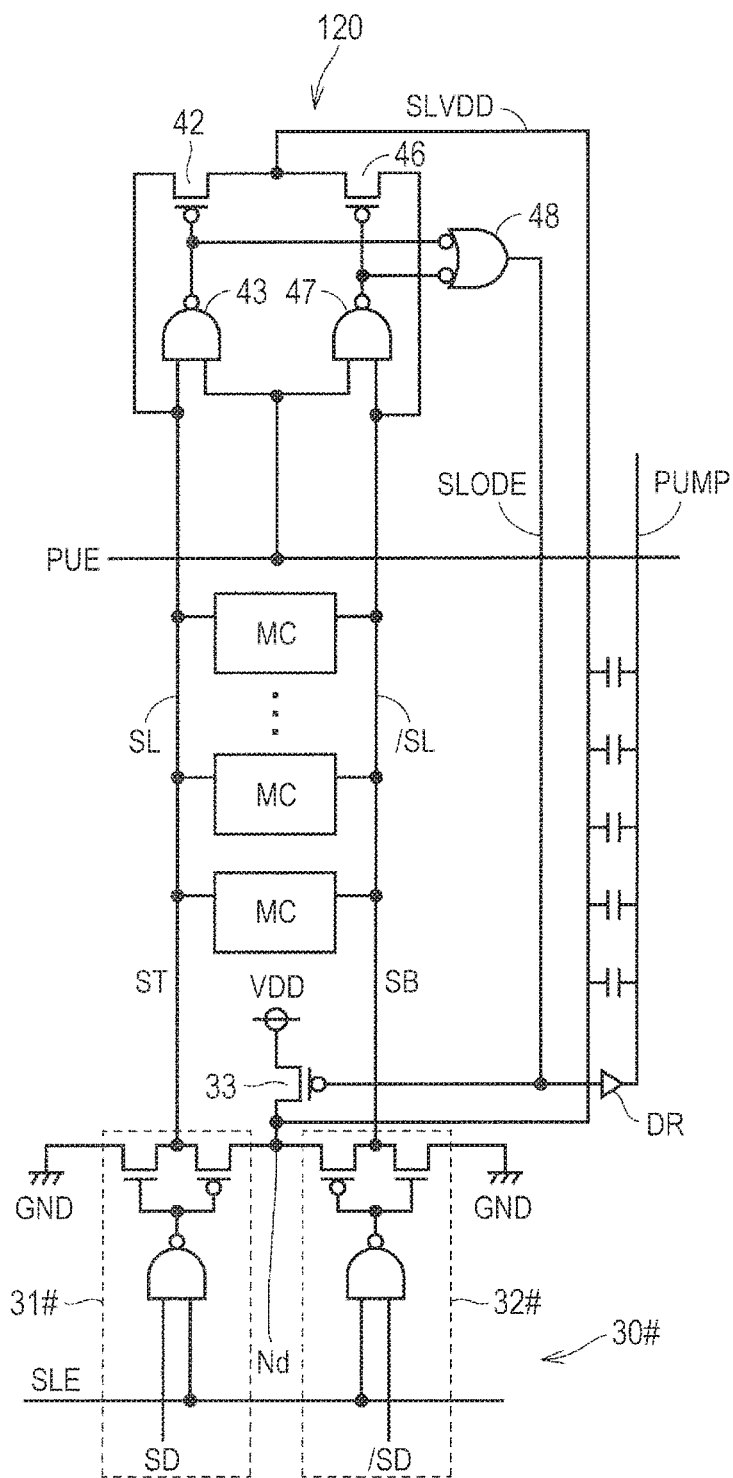
FIG. 15 is a diagram for explaining a configuration of a search line driver 30# and an assist circuit 120 based on a fourth embodiment.

FIG. 15 is a diagram for explaining a configuration of a search line driver 30# and an assist circuit 120 based on a fourth embodiment.

Referring to FIG. 15, the assist circuit 120 is different from the assist circuit 100 in FIG. 10 in that the OR circuit 48 is provided instead of the OR circuit OR, and the P-channel MOS transistors 42 and 46 and the NAND circuits 43 and 47 are provided. The other configurations are the same as those described in FIG. 10, so that the detailed description thereof will not be repeated.

Specifically, the assist circuit 120 is supplied with a raised voltage instead of the power supply voltage VDD.

The P-channel MOS transistor 42 is provided between the sub power supply wiring SLVDD and the search line SL and the gate receives input from the NAND circuit 43.

The P-channel MOS transistor 46 is provided between the sub power supply wiring SLVDD and the search line /SL and the gate receives input from the NAND circuit 47.

The NAND circuit 43 outputs a NAND logical operation result of the control signal PUE and the data ST to the gate of the P-channel MOS transistor 42.

The NAND circuit 47 outputs a NAND logical operation result of the control signal PUE and the data SB to the gate of the P-channel MOS transistor 46.

The OR circuit 48 receives inputs of an inverted signal of the output signal of the NAND circuit 43 and an inverted signal of the output signal of the NAND circuit 47 and outputs an OR logical operation result to the signal wiring SLODE.

The sub power supply wiring SLVDD is coupled to the power supply node Nd and is also coupled to a coupling node between the P-channel MOS transistors 42 and 46.

Figure 16:
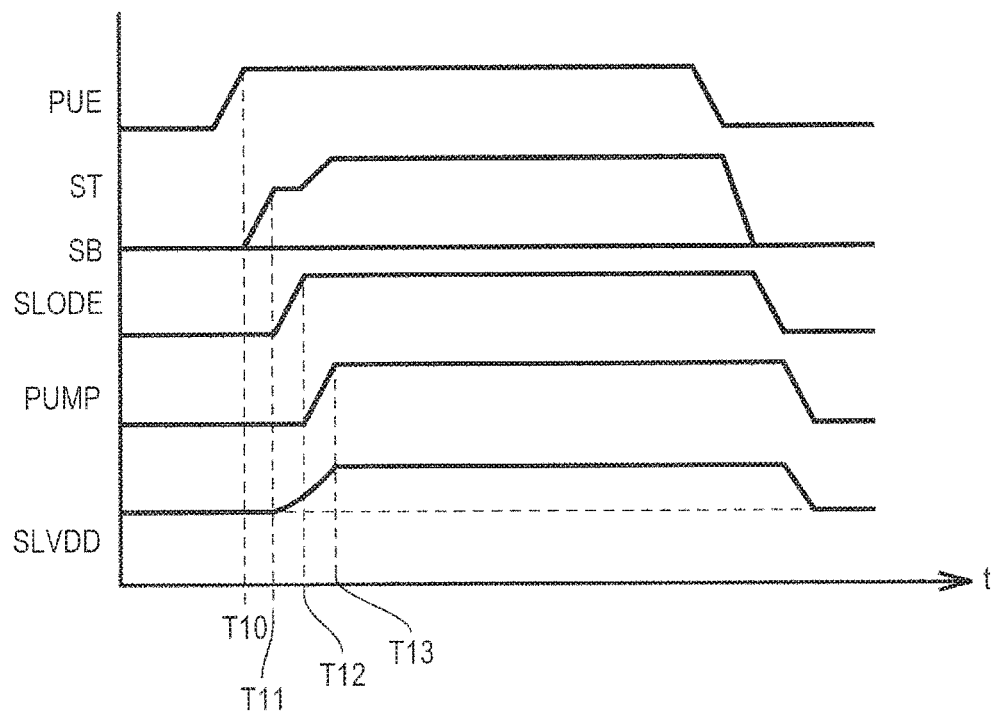
FIG. 16 is a timing chart for explaining an operation of the assist circuit 120 based on the fourth embodiment.

FIG. 16 is a timing chart for explaining an operation of the assist circuit 120 based on the fourth embodiment.

Referring to FIG. 16, the control signal PUE is set to "H" level at time T10. Thereby, the assist circuit 120 is activated. At time T11, the data ST and SB are set to "H" level and "L" level, respectively. Accordingly, the P-channel MOS transistor 42 turns on. Thereby, the other end side of the search line SL is coupled to the sub power supply wiring SLVDD.

At time T12, the signal wiring SLODE rises. Thereby, the sub power supply wiring SLVDD becomes a high impedance state. Further, the signal wiring PUMP is driven to "H" level by the driver DR. Therefore, the voltage level of the sub power supply wiring SLVDD rises according to an inter-wiring capacitance. A case is shown where the voltage level of the search line SL further rises at time T13.

In this case, the sub power supply wiring SLVDD is coupled to both one end side and the other end side of the search line SL.

Thereby, it is possible to accelerate the search operation.

A raised voltage is applied also from the other end side of the search line SL, so that the far end side can be quickly raised to "H" level.

Fifth Embodiment

Figure 17:
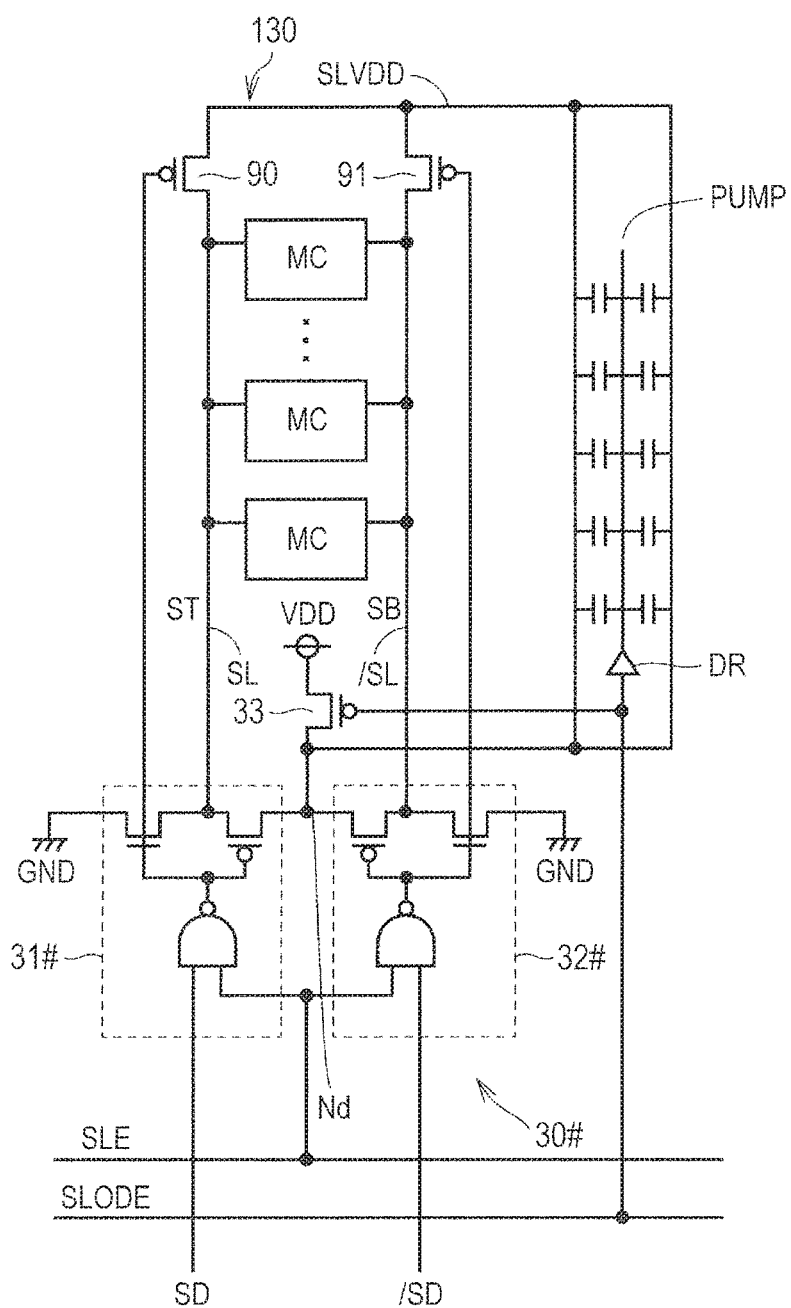
FIG. 17 is a diagram for explaining a configuration of a search line driver 30# and an assist circuit 130 based on a fifth embodiment.

FIG. 17 is a diagram for explaining a configuration of a search line driver 30# and an assist circuit 130 based on a fifth embodiment.

Referring to FIG. 17, the assist circuit 130 is different from the assist circuit 120 in FIG. 15 in that the P-channel MOS transistors 90 and 91 are provided instead of the P-channel MOS transistors 42 and 46, and the NAND circuits 43 and 47, the OR circuit 48, and the signal wiring SLODE are deleted.

Further, a case is shown where the signal wiring PUMP is driven by the driver DR according to a control signal SLDE. The control signal SLDE is inputted into the gate of the P-channel MOS transistor 33. The sub power supply wiring SLVDD is coupled to the power supply node Nd and is also coupled to the other end sides of the search lines SL and /SL through the P-channel MOS transistors 90 and 91.

The P-channel MOS transistor 90 is provided between the sub power supply wiring SLVDD and the search line SL, and the gate of the P-channel MOS transistor 90 receives an input of an output signal of the NAND circuit in the search line driver unit 31#.

The P-channel MOS transistor 91 is provided between the sub power supply wiring SLVDD and the search line /SL, and the gate of the P-channel MOS transistor 91 receives an input of an output signal of the NAND circuit in the search line driver unit 32#.

In the present example, a configuration is shown where the sub power supply wiring SLVDD is provided on both sides of the signal wiring PUMP. However, the sub power supply wiring SLVDD may be provided on only one side of the signal wiring PUMP.

Figure 18:
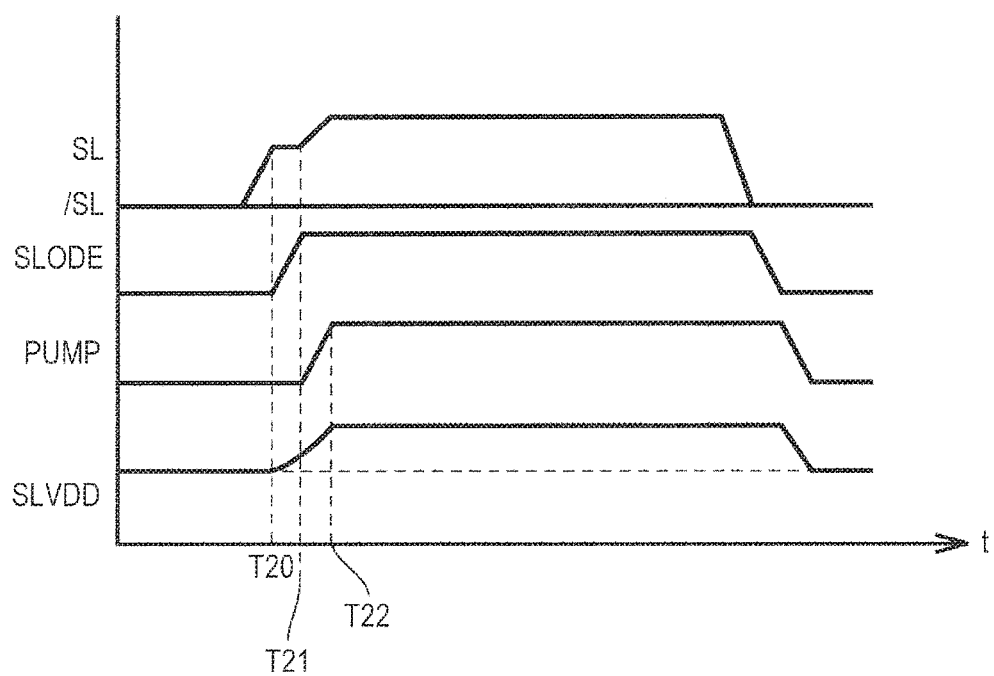
FIG. 18 is a timing chart for explaining an operation of the assist circuit 130 based on the fifth embodiment.

FIG. 18 is a timing chart for explaining an operation of the assist circuit 130 based on the fifth embodiment.

Referring to FIG. 18, at time T20, the data ST and SB are set to "H" level and "L" level, respectively. Accordingly, the search line SL is set to "H" level. Further, the P-channel MOS transistor 90 is on. Therefore, the sub power supply wiring SLVDD and the search line SL are coupled with each other.

At time T21, the control signal SLDE ("H" level) is inputted. Thereby, the sub power supply wiring SLVDD becomes a high impedance state. Further, the signal wiring PUMP is driven to "H" level by the driver DR. Therefore, the voltage level of the sub power supply wiring SLVDD rises according to an inter-wiring capacitance. A case is shown where the voltage level of the search line SL further rises at time T22.

In this case, the sub power supply wiring SLVDD is coupled to both one end side and the other end side of the search line SL.

Thereby, it is possible to accelerate the search operation.

A raised voltage is applied also from the other end side of the search line SL, so that the far end side can be quickly raised to "H" level.

Modified Example

Figure 19:
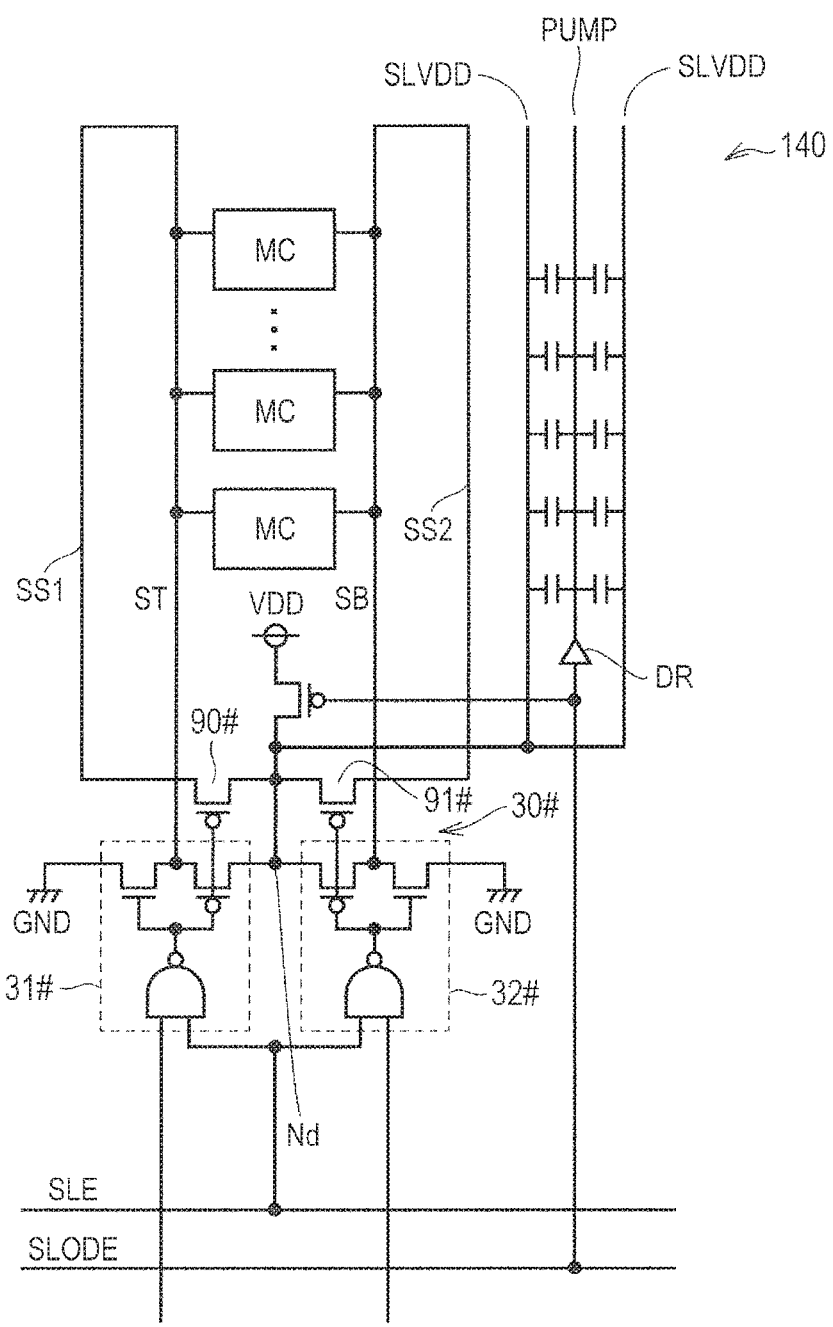
FIG. 19 is a diagram for explaining a configuration of a search line driver 30# and an assist circuit 140 based on a modified example of the fifth embodiment.

FIG. 19 is a diagram for explaining a configuration of a search line driver 30# and an assist circuit 140 based on a modified example of the fifth embodiment.

Referring to FIG. 19, the arrangement of the P-channel MOS transistors in the assist circuit 140 is different from the arrangement of the P-channel MOS transistor in the assist circuit 130 in FIG. 17.

Specifically, P-channel MOS transistors 90# and 91# are provided on the search line driver side, and signal wirings SS1 and SS2 are further provided.

The search line SL and the signal wiring SS1 are coupled at an end portion.

The search line /SL and the signal wiring SS2 are coupled at an end portion.

The P-channel MOS transistor 90# is provided between the signal wiring SS1 and the power supply node Nd, and the gate of the P-channel MOS transistor 90# receives an input of an output signal of the NAND circuit in the search line driver unit 31#.

The P-channel MOS transistor 91# is provided between the signal wiring SS2 and the power supply node Nd, and the gate of the P-channel MOS transistor 91# receives an input of an output signal of the NAND circuit in the search line driver unit 32#.

In the present example, a configuration is shown where the sub power supply wiring SLVDD is provided on both sides of the signal wiring PUMP. However, the sub power supply wiring SLVDD may be provided on only one side of the signal wiring PUMP.

For example, when the control signal SLE is "H" level and the search data SD and /SD are "H" level and "L" level, respectively, the data ST becomes "H" level.

Further, the P-channel MOS transistor 90# turns on.

Therefore, the signal wiring SS1 is coupled with the power supply node Nd.

Next, the control signal SLDE ("H" level) is inputted. Thereby, the sub power supply wiring SLVDD becomes a high impedance state. Further, the signal wiring PUMP is driven to "H" level by the driver DR. Therefore, the voltage level of the sub power supply wiring SLVDD rises according to an inter-wiring capacitance.

In this case, the sub power supply wiring SLVDD is coupled with the power supply node Nd.

Thereby a raised voltage is applied also from the other end side of the search line SL through the signal wiring SS1, so that the far end side can be quickly raised to "H" level.

Figure 20A:
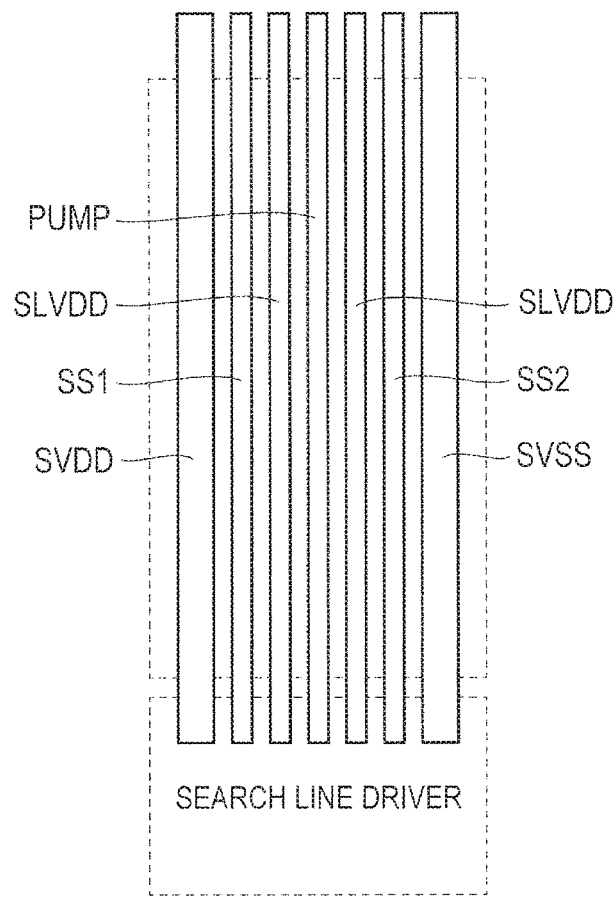
FIGS. 20A and 20B are diagrams for explaining a layout configuration of signal wirings according to the modified example of the fifth embodiment.
Figure 20B:
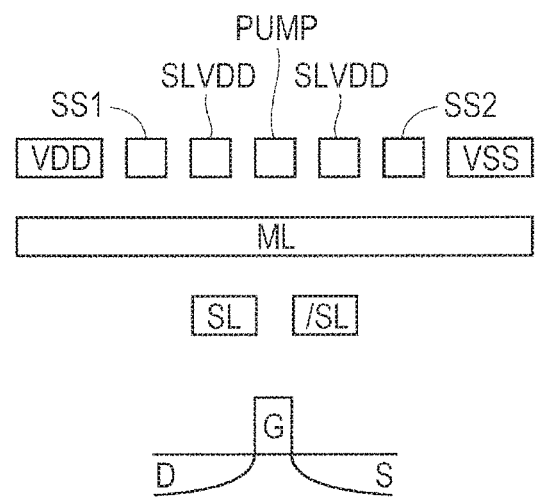

FIGS. 20A and 20B are diagrams for explaining a layout configuration of signal wirings according to the modified example of the fifth embodiment.

As shown in FIG. 20A, the signal wirings SS1, SS2, and PUMP, the sub power supply wirings SLVDD, the power supply wiring SVDD to which the power supply voltage VDD is supplied, and the ground wiring SVSS to which the ground voltage GND is supplied are shown.

Here, the signal wirings SS1, SS2, and PUMP, the two sub power supply wirings SLVDD, the power supply wiring SVDD to which the power supply voltage VDD is supplied, and the ground wiring SVSS to which the ground voltage GND is supplied are arranged in parallel with each other.

As shown in FIG. 20B, a transistor is formed in the lowest layer, and the search lines SL and /SL are formed over the transistor. Further, the match line ML is formed over the search lines SL and /SL. Furthermore, the signal wirings SS1, SS2, and PUMP, the two sub power supply wirings SLVDD, the power supply wiring SVDD, and the ground wiring SVSS are formed over the match line ML.

The signal wiring PUMP is arranged between the two sub power supply wirings SLVDD. When the signal wiring PUMP is driven by the driver DR, the voltage of the two sub power supply wirings SLVDD is raised. Thereby, it is possible to further raise the voltage level to be raised.

Another Embodiment

In the embodiments described above, a method of redriving the far end of the search line is described.

On the other hand, the method can also be applied to other signal lines in addition to the search line.

Figure 21:
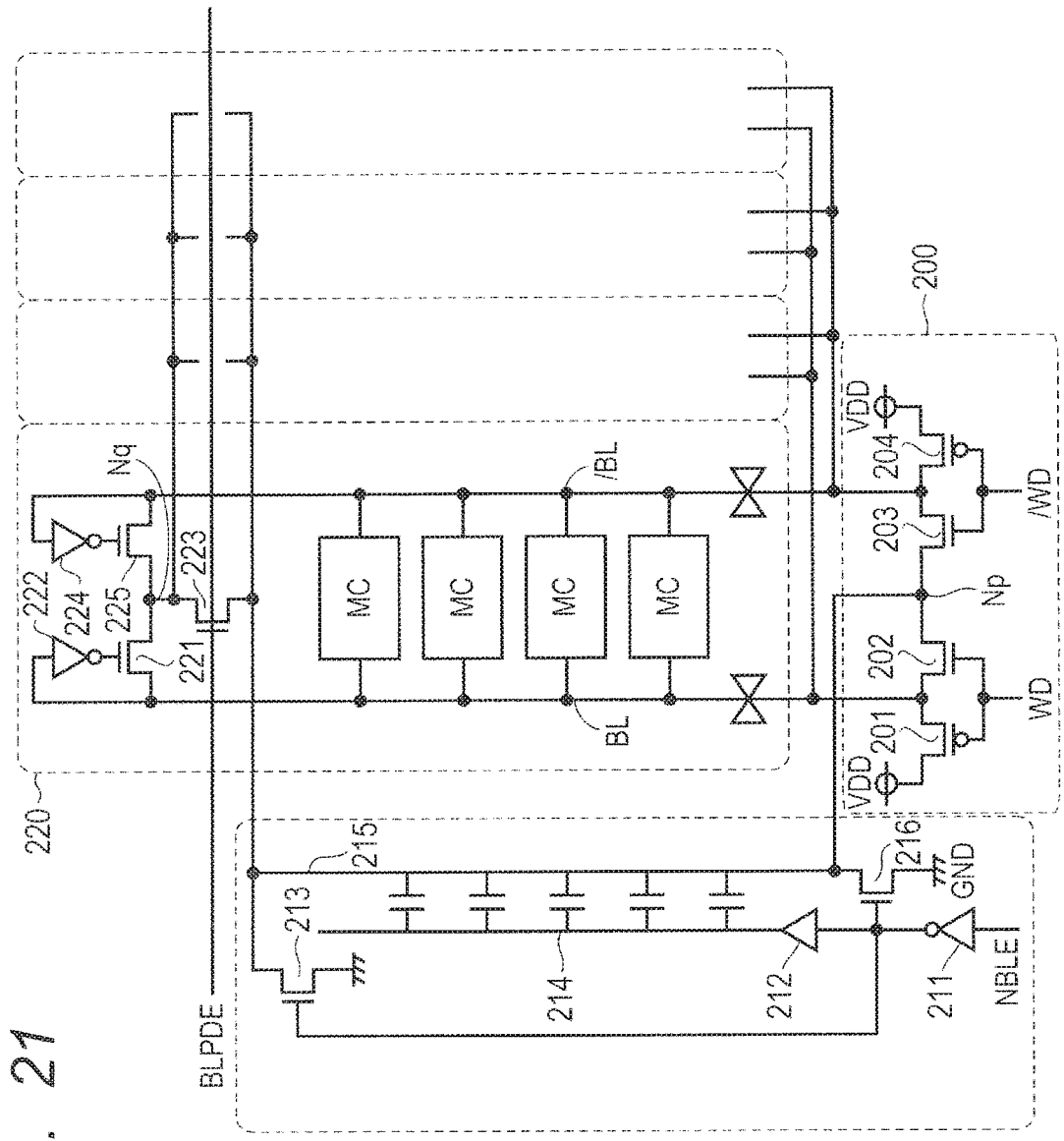
FIG. 21 is a diagram for explaining a configuration of a semiconductor device according to another embodiment.

FIG. 21 is a diagram for explaining a configuration of a semiconductor device according to the other embodiment.

Referring to FIG. 21, in the present example, a configuration of a bit line driver 200, an assist power supply control unit 210, and an assist circuit 220 will be described.

The bit line driver 200 will be described.

The bit line driver 200 is arranged at one end sides of bit line BL and /BL.

The bit line driver 200 includes P-channel MOS transistors 201 and 204 and N-channel MOS transistors 202 and 203.

The P-channel MOS transistor 201 and the N-channel MOS transistor 202 are provided between the power supply voltage VDD and the ground voltage GND and the gates of these transistors receive input of writer data WD.

The N-channel MOS transistor 203 and the P-channel MOS transistor 204 are provided between the power supply voltage VDD and the ground voltage GND and the gates of these transistors receive input of writer data /WD.

The N-channel MOS transistor 202 and the N-channel MOS transistor 203 are coupled to a ground node Np.

A coupling node between the P-channel MOS transistor 201 and the N-channel MOS transistor 202 is coupled with the bit line BL through a transfer gate.

A coupling node between the P-channel MOS transistor 204 and the N-channel MOS transistor 203 is coupled with the bit line /BL through a transfer gate.

For example, when the write data WD and /WD are set to "H" level and "L" level, respectively, the N-channel MOS transistor 202 and the P-channel MOS transistor 201 turn on. Accordingly, the bit line BL is coupled with the ground node Np through a transfer gate. The bit line /BL is coupled with the power supply voltage VDD through a transfer gate.

The assist power supply control unit 210 will be described.

The assist power supply control unit 210 includes an inverter 211, a driver 212, N-channel MOS transistors 213 and 216, and signal wirings 214, 215, and 217.

The signal wirings 214 and 215 are arranged in parallel with each other. As an example, the signal wirings 214 and 215 are arranged in a bit line direction. However, the arrangement direction is not particularly limited to the bit line direction, but may be another direction.

The N-channel MOS transistor 216 is provided between the signal wiring 215 and the ground voltage GND, and the gate of the N-channel MOS transistor 216 receives an input of a control signal NBLE through the inverter 211.

The driver 212 receives an input of the control signal NBLE through the inverter 211 and drives the signal wiring 214. In inverter 211 inverts the control signal NBLE and outputs the inverted control signal NBLE.

The N-channel MOS transistor 213 is provided between the signal wiring 215 and the ground voltage GND, and the gate of the N-channel MOS transistor 213 receives an input of an output signal of the inverter 211.

The N-channel MOS transistor 213 need not necessarily be provided.

In the initial state, the control signal NBLE is set to "L" level.

Therefore, the output signal of the inverter 211 is set to "H" level. Accordingly, the N-channel MOS transistors 213 and 216 are on. Therefore, the signal wiring 215 is coupled with the ground voltage GND.

The assist circuit 220 includes inverters 222 and 224 and N-channel MOS transistors 221, 223, and 225.

The inverter 222 is coupled with the bit line BL.

The inverter 224 is coupled with the bit line /BL.

The N-channel MOS transistor 221 is provided between the bit line BL and a node Nq, and the gate of the N-channel MOS transistor 221 receives an input of an output signal of the inverter 222.

The N-channel MOS transistor 225 is provided between the bit line /BL and the node Nq, and the gate of the N-channel MOS transistor 225 receives an input of an output signal of the inverter 224.

The N-channel MOS transistor 223 is provided between the node Nq and the signal wiring 215, and the gate of the N-channel MOS transistor 223 receives an input of a control signal BLPDE.

When the bit line BL is "H" level and the bit line /BL is "L" level, the N-channel MOS transistor 225 turns on. Thereby, the node Nq and the bit line /BL are coupled with each other.

When the bit line BL is "L" level and the bit line /BL is "H" level, the N-channel MOS transistor 221 turns on. Thereby, the node Nq and the bit line BL are coupled with each other.

Then, the signal wiring 215 and the node Nq are coupled with each other according to an input of the control signal BLPDE ("H" level).

Figure 22:
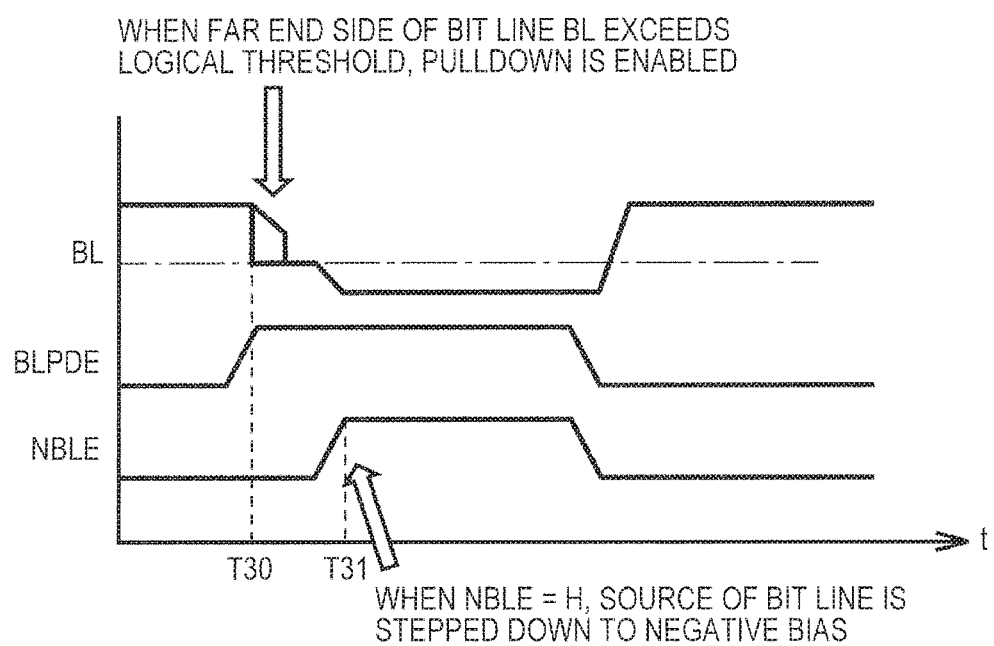
FIG. 22 is a timing chart for explaining an operation of an assist power supply control unit 210 and an assist circuit 220 based on the other embodiment.

FIG. 22 is a timing chart for explaining an operation of the assist power supply control unit 210 and the assist circuit 220 based on the other embodiment.

Referring to FIG. 22, a case will be described where the write data WD and /WD are set to "H" level and "L" level, respectively. At time T30, the N-channel MOS transistor 202 turns on. Therefore, a case is shown where the near end side of the bit line BL is set to "L" level which is the ground voltage GND. On the far end side of the bit line BL, the N-channel MOS transistor 221 turns on through the inverter 222.

Further, the control signal BLPDE is set to "H" level. Accordingly, the N-channel MOS transistor 223 turns on. Therefore, the node Nq and the signal wiring 215 are coupled with each other. Accordingly, the far end side of the bit line BL is also set to "L" level which is the ground voltage GND.

Next, at time T30, the control signal NBLE is set to "H" level.

Accordingly, the inverter 211 outputs "L" level. Therefore, the N-channel MOS transistors 213 and 216 turn off. Therefore, the signal wiring 215 becomes a high impedance state.

Then, the driver 212 drives the "L" level which is the output signal of the inverter 211 to the signal wiring 214.

Accordingly, the voltage level of the signal wiring 215 is set to a voltage level lower than the ground voltage GND based on an inter-wiring capacitance.

In other words, the voltage of the bit line BL further drops from the ground voltage GND. Thereby, it is possible to improve write margin.

In the same manner as in the search lines SL and /SL, it is possible to provide a bit line driver corresponding to each of one end sides of a plurality of bit lines BL and /BL provided corresponding to each memory cell column and provide assist circuits for assisting drive of corresponding bit lines BL and /BL according to data transmitted to the bit lines BL and /BL on the other end sides. The same method as that described in the search lines SL and /SL can be applied to the bit lines.

Modified Example 1

Figure 23:
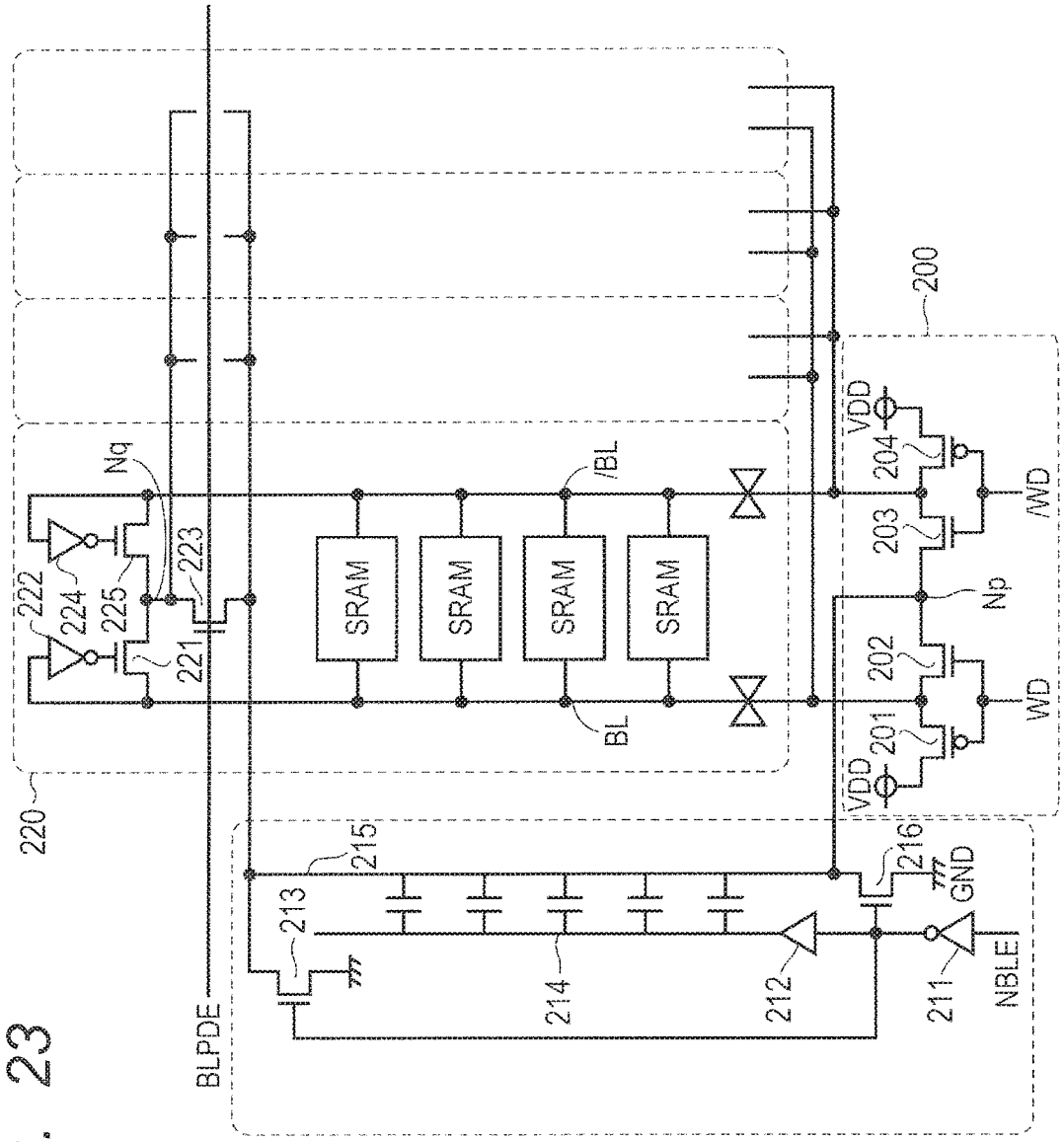
FIG. 23 is a diagram for explaining a configuration of a semiconductor device according to a different embodiment.

FIG. 23 is a diagram for explaining a configuration of a semiconductor device according to a different embodiment.

Referring to FIG. 23, the semiconductor device according to the different embodiment is different from the semiconductor device shown in FIG. 21 in that the memory cells MC are replaced by SRAM memory cells. The other configurations are the same as those described in FIG. 21, so that the detailed description thereof will not be repeated.

That is, it is possible to apply the method described above to not only the TCAM cells but also to the SRAM cells.

Modified Example 2

In the different embodiment described above, a method of improving write margin by dropping the voltage of the bit line is described.

On the other hand, the method can be applied not only to the bit lines BL and /BL but also to the word line WL in the same manner.

Figure 24:
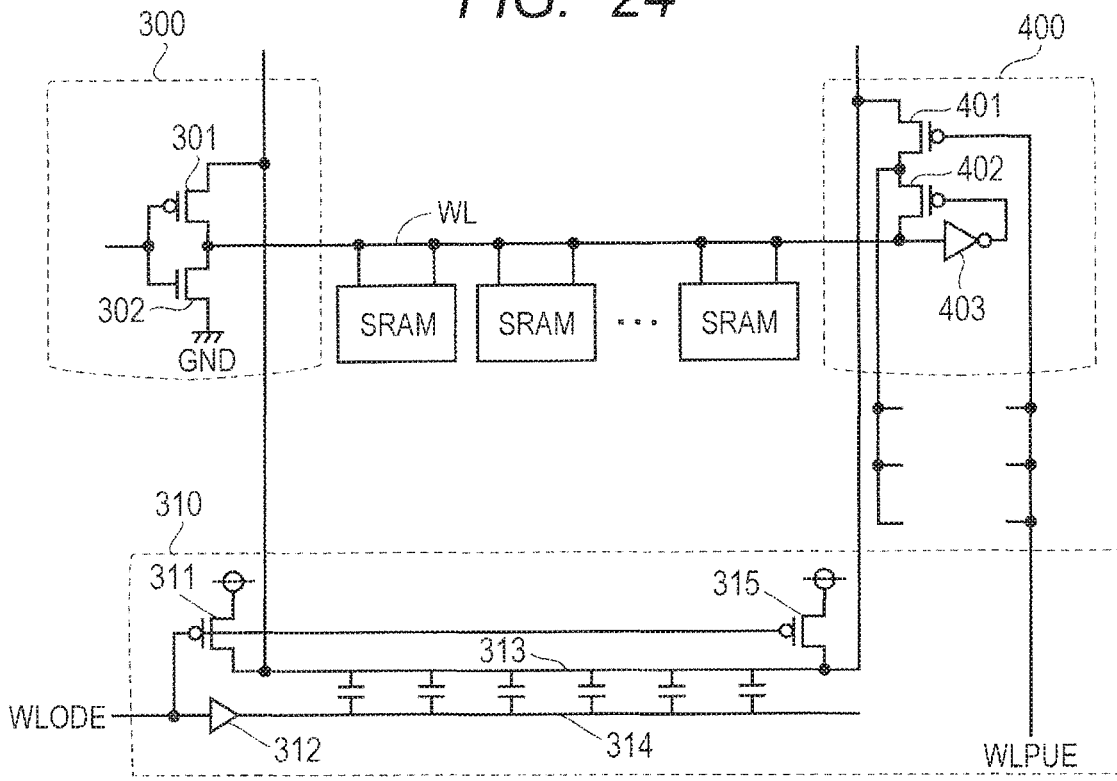
FIG. 24 is a diagram for explaining a configuration of a semiconductor device according to a further different embodiment.

FIG. 24 is a diagram for explaining a configuration of a semiconductor device according to a further different embodiment.

Referring to FIG. 24, when comparing with the configuration of the semiconductor device shown in FIG. 23, a configuration around the word line WL is shown instead of the configuration of the bit lines BL and /BL.

In the present example, FIG. 24 is a diagram for explaining a configuration of a word line driver 300, an assist power supply control unit 310, and an assist circuit 400.

The word line driver 300 will be described.

The word line driver 300 is arranged at one end side of the word line WL.

The word line driver 300 includes a P-channel MOS transistor 301 and an N-channel MOS transistor 302.

The P-channel MOS transistor 301 and the N-channel MOS transistor 302 are provided between a signal wiring 313 and the ground voltage GND. The gates of the transistors receives an input of a decode signal X. A coupling node Nr between the P-channel MOS transistor 301 and the N-channel MOS transistor 302 is coupled with the word line WL.

When the decode signal X is "L" level, the word line driver 300 is activated.

The P-channel MOS transistor 301 turns on. Thereby, the signal wiring 313 is coupled with the coupling node Nr.

The assist power supply control unit 310 will be described.

The assist power supply control unit 310 includes a driver 312, P-channel MOS transistors 311 and 315, and signal wirings 313 and 314.

The signal wirings 313 and 314 are arranged in parallel with each other. As an example, the signal wirings 214 and 215 are arranged in a word line direction. However, the arrangement direction is not particularly limited to the word line direction, but may be another direction.

The P-channel MOS transistor 311 is provided between the signal wiring 313 and the power supply voltage VDD, and the gate of the P-channel MOS transistor 311 receives an input of a control signal WLODE.

The driver 312 receives an input of the control signal WLODE and drives the signal wiring 314.

The P-channel MOS transistor 315 is provided between the signal wiring 313 and the power supply voltage VDD, and the gate of the P-channel MOS transistor 315 receives an input of the control signal WLODE.

The P-channel MOS transistor 315 need not necessarily be provided.

In the initial state, the control signal WLODE is set to "L" level.

Therefore, the P-channel MOS transistors 311 and 315 are on. Therefore, the signal wiring 313 is coupled with the power supply voltage VDD.

The assist circuit 400 includes an inverter 403 and P-channel MOS transistors 401 and 402.

The inverter 403 is coupled with the word line WL.

The P-channel MOS transistors 401 and 402 are provided between the signal wiring 313 and the word line WL. The gate of the P-channel MOS transistor 401 receives an input of a control signal WLPUE.

The gate of the P-channel MOS transistor 402 receives an input of an output signal of the inverter 403.

When the word line WL is "H" level, the P-channel MOS transistor 402 turns on. When the control signal WLPUE is set to "L" level, the P-channel MOS transistor 401 turns on. Thereby, the signal wiring 313 and the other end side of the word line WL are coupled.

Figure 25:
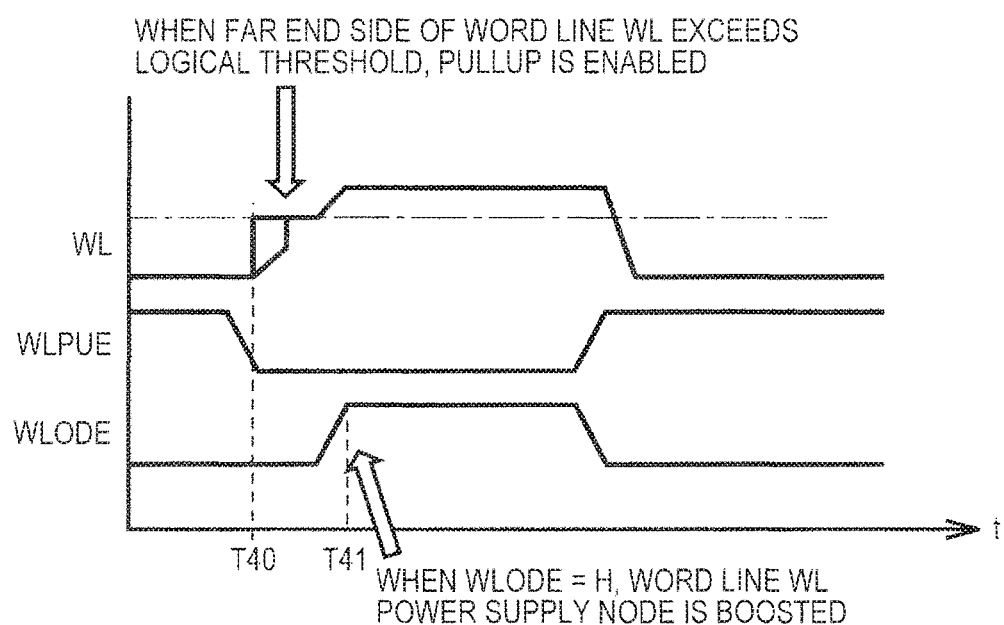
FIG. 25 is a timing chart for explaining an operation of an assist power supply control unit 310 and an assist circuit 400 based on the further different embodiment.

FIG. 25 is a timing chart for explaining an operation of the assist power supply control unit 310 and the assist circuit 400 based on the further different embodiment.

A case where the decode signal X is set to "L" level will be described with reference to FIG. 25. At time T40, the P-channel MOS transistor 301 turns on. Therefore, the near end side of the word line WL is coupled with the signal wiring 313 that is coupled with the power supply voltage VDD.

Thereby, a case where the word line WL is set to "H" level, which is the power supply voltage VDD, is shown.

Then, on the far end side of the word line WL, the P-channel MOS transistor 402 turns on through the invertor 403.

Further, the control signal WLPUE is set to "L" level. Accordingly, the P-channel MOS transistor 401 turns on. Therefore, the far end side (the other end side) of the word line WL is coupled with the signal wiring 313. Accordingly, the far end side of the word line WL is also set to "H" level, which is the power supply voltage VDD.

Next, at time T41, the control signal WLODE is set to "H" level.

Accordingly, the P-channel MOS transistors 311 and 315 turn off. Therefore, the signal wiring 313 becomes a high impedance state.

Then, the driver 312 drives "H" level to the signal wiring 314 according to the control signal WLODE.

Accordingly, the voltage level of the signal wiring 313 is set to a voltage level higher than the power supply voltage VDD based on an inter-wiring capacitance.

In other words, the voltage of the word line WL is raised higher than the power supply voltage VDD. Thereby, it is possible to improve read margin.

In the same manner as in the search lines SL and /SL, it is possible to provide a word line driver corresponding to each of one end sides of a plurality of word lines provided corresponding to each memory cell row and provide assist circuits for assisting drive of corresponding word lines WL according to data transmitted to the word lines WL on the other end sides. The same method as that described in the search lines SL and /SL can be applied to the word lines.

While the present disclosure has been specifically described based on the embodiments, it is needless to say that the present disclosure is not limited to the embodiments and can be variously modified without departing from the scope of the disclosure.

What is claimed is:

1. A semiconductor device comprising:
a plurality of search memory cells;
a search line pair which transmits a search data to be compared with data stored in the search memory cells;
a search driver which is coupled with one end side of the search line pair for driving the search line pair according to the search data; and
a circuit which is coupled with the other end side of the search line pair and which assists driving the search line pair.

2. The semiconductor device according to claim 1,
wherein the search line pair includes a search line and a complementary search line, and
wherein the search driver drives either one of the search line and the complementary search line according to the search data.

3. The semiconductor device according to claim 2,
wherein the circuit drives either one of the search line and the complementary search line according to the search data.

4. The semiconductor device according to claim 2,
wherein the circuit includes
a first unit coupled with the search line, and
a second unit coupled with the complementary search line.

5. The semiconductor device according to claim 4,
wherein the first and the second units include an inverter that operates according to the search data.

6. The semiconductor device according to claim 2,
wherein the circuit raises a voltage of either one of the search line and the complementary search line.

7. The semiconductor device according to claim 6,
wherein the circuit includes
a first signal wiring that transmits driven data to the search line and the complementary search line, and
a second signal wiring which is coupled with one end side of either one of the search line and the complementary search line and arranged in parallel with the first signal wiring and which raises a voltage on one end side of either one of the search line and the complementary search line by coupling capacitance between signal wirings.

8. A semiconductor device comprising:
a plurality of search memory cells arranged in a matrix form;
a plurality of search line pairs which are respectively provided corresponding to memory cell columns and which respectively transmit a plurality of search data to be compared with data stored in the search memory cells;
a plurality of search drivers which are respectively arranged at corresponding to one end sides of the search line pairs and which drive the search line pairs according to the search data; and
a plurality of assist circuits which are respectively provided corresponding to the other end sides of the search line pairs and which assist driving corresponding search line pairs according to the search data.

9. The semiconductor device according to claim 8,
wherein each search line pair includes a search line and a complementary search line,
wherein each search driver drives either one of a corresponding search line and a corresponding complementary search line according to the search data, and
wherein each assist circuit assists driving either one of the corresponding search line and the corresponding complementary search line according to the drive of either one of the corresponding search line and the corresponding complementary search line.

10. The semiconductor device according to claim 9,
wherein each assist circuit includes a logic circuit that drives either one of the corresponding search line and the corresponding complementary search line according to the search data.

11. The semiconductor device according to claim 8,
wherein each search line pair includes a search line and a complementary search line,
wherein each search driver drives either one of a corresponding search line and a corresponding complementary search line according to the search data, and
wherein each assist circuit includes
a first assist unit that assists driving the corresponding search line according to the drive of the corresponding search line, and
a second assist unit that assists driving the corresponding complementary search line according to the drive of the corresponding complementary search line.

12. The semiconductor device according to claim 11,
wherein the first and the second assist units are composed of an inverter that operates according to the search data.

13. The semiconductor device according to claim 11,
wherein one side of the first assist unit is coupled with the other end side of the search line, the other side of the first assist unit is coupled with a power supply voltage, and the first assist unit includes a first transistor whose gate receives an input of the search data, and
wherein one side of the second assist unit is coupled with the other end side of the complementary search line, the other side of the second assist unit is coupled with the power supply voltage, and the second assist unit includes a second transistor whose gate receives an input of the search data that is inverted.

14. The semiconductor device according to claim 13,
wherein the first and the second transistors are arranged close to the search drivers.

15. The semiconductor device according to claim 9,
wherein each assist circuit raises a voltage of either one of the corresponding search line and the corresponding complementary search line.

16. The semiconductor device according to claim 15,
wherein each assist circuit includes
a first signal wiring that transmits driven data to the corresponding search line and the corresponding complementary search line, and
a second signal wiring which is coupled with one end side of either one of the corresponding search line and the corresponding complementary search line and arranged in parallel with the first signal wiring and which raises a voltage on one end side of either one of the corresponding search line and the corresponding complementary search line by coupling capacitance between signal wirings.

17. The semiconductor device according to claim 15,
wherein each assist circuit includes
a first signal wiring that transmits driven data to the corresponding search line and the corresponding complementary search line, and
a plurality of second signal wirings which is coupled with one end side of either one of the corresponding search line and the corresponding complementary search line and arranged in parallel with the first signal wiring and which raises a voltage on one end side of either one of the corresponding search line and the corresponding complementary search line by coupling capacitance between signal wirings.

18. The semiconductor device according to claim 15,
wherein each assist circuit includes
a first signal wiring that transmits driven data to the corresponding search line and the corresponding complementary search line, and
a second signal wiring which is coupled with one end side and the other end side of either one of the corresponding search line and the corresponding complementary search line and arranged in parallel with the first signal wiring and which raises voltages on one end side and the other end side of either one of the corresponding search line and the corresponding complementary search line by coupling capacitance between signal wirings.

19. The semiconductor device according to claim 15,
wherein each assist circuit includes
a first signal wiring that transmits a timing signal, and
a second signal wiring which is coupled with one end side and the other end side of either one of the corresponding search line and the corresponding complementary search line and arranged in parallel with the first signal wiring and which raises voltages on one end side and the other end side of either one of the corresponding search line and the corresponding complementary search line by coupling capacitance between signal wirings.

* * * * *